(12) United States Patent
Kusunoki et al.

(10) Patent No.: US 9,484,444 B2
(45) Date of Patent: Nov. 1, 2016

(54) SEMICONDUCTOR DEVICE WITH A RESISTANCE ELEMENT IN A TRENCH

(75) Inventors: Shigeru Kusunoki, Chiyoda-ku (JP); Koichi Mochizuki, Chiyoda-ku (JP); Minoru Kawakami, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 333 days.

(21) Appl. No.: 12/110,621

(22) Filed: Apr. 28, 2008

(65) Prior Publication Data

US 2008/0290407 A1 Nov. 27, 2008

(30) Foreign Application Priority Data

May 25, 2007 (JP) .................................. 2007-139509

(51) Int. Cl.
*H01L 29/66* (2006.01)
*H01L 29/739* (2006.01)
*H01L 27/06* (2006.01)
*H01L 29/10* (2006.01)
(Continued)

(52) U.S. Cl.
CPC ....... *H01L 29/7395* (2013.01); *H01L 27/0611* (2013.01); *H01L 29/1095* (2013.01); *H01L 29/4232* (2013.01); *H01L 29/4238* (2013.01); *H01L 29/42356* (2013.01); *H01L 29/66333* (2013.01); *H01L 29/7803* (2013.01); *H01L 29/7804* (2013.01); *H01L 29/7808* (2013.01); *H01L 29/7813* (2013.01); *H01L 29/0696* (2013.01); *H01L 2924/0002* (2013.01)

(58) Field of Classification Search
CPC ........... H01L 29/7813; H01L 29/0696; H01L 29/7397; H01L 29/4236; H01L 29/7395; H01L 27/0629; H01L 29/4232; H01L 29/872; H01L 2924/3011; H01L 29/407
USPC ......... 257/E29.201, E29.027, 154, 245, 350; 1/E29.201
See application file for complete search history.

(56) References Cited

U.S. PATENT DOCUMENTS

| 4,653,176 A | 3/1987 | Van Ommen |
| 5,115,369 A | 5/1992 | Robb et al. |

(Continued)

FOREIGN PATENT DOCUMENTS

| CN | 1242604 A | 1/2000 |
| DE | 199 60 563 A1 | 6/2001 |

(Continued)

OTHER PUBLICATIONS

Office Action issued Jul. 25, 2011, in German Patent Application No. 10 2008 064 686.5 (with English-language translation).

(Continued)

*Primary Examiner* — David Chen
(74) *Attorney, Agent, or Firm* — Oblon, McClelland, Maier & Neustadt, L.L.P.

(57) ABSTRACT

A semiconductor device has a semiconductor substrate, an insulating film, a semiconductor element and a resistance element. The semiconductor substrate has a first trench. The insulating film covers an inner surface of the first trench. The semiconductor element has an electrode. The resistance element is electrically connected to the electrode to form a resistance to a current flowing through the electrode, and is arranged in the first trench with the insulating film therebetween. Thereby, the semiconductor device can have a resistance element that has a small footprint and can pass a large current with high reliability.

13 Claims, 34 Drawing Sheets

(51) Int. Cl.
*H01L 29/423* (2006.01)
*H01L 29/78* (2006.01)
*H01L 29/06* (2006.01)

(56) References Cited

U.S. PATENT DOCUMENTS

| | | | |
|---|---|---|---|
| 5,341,004 A | 8/1994 | Furuhata | |
| 5,352,923 A | 10/1994 | Boyd et al. | |
| 5,602,408 A | 2/1997 | Watanabe et al. | |
| 5,631,494 A | 5/1997 | Sakurai et al. | |
| 5,721,148 A | 2/1998 | Nishimura | |
| 5,856,702 A * | 1/1999 | Hashimoto | H01L 28/20 257/516 |
| 6,238,962 B1 * | 5/2001 | Kim | 438/206 |
| 6,320,241 B1 * | 11/2001 | Okamoto | H01L 27/0629 257/528 |
| 6,353,252 B1 * | 3/2002 | Yasuhara et al. | 257/487 |
| 2001/0009287 A1 * | 7/2001 | Fujihira et al. | 257/328 |
| 2002/0050603 A1 | 5/2002 | Kawamoto | |
| 2002/0088991 A1 | 7/2002 | Hisamoto | |
| 2003/0071357 A1 * | 4/2003 | Trivedi | 257/758 |
| 2004/0185622 A1 * | 9/2004 | Williams et al. | 438/270 |
| 2005/0062105 A1 * | 3/2005 | Nakamura et al. | 257/341 |
| 2005/0161768 A1 | 7/2005 | Sugiyama et al. | |
| 2005/0194635 A1 | 9/2005 | Pfirsch | |
| 2005/0230777 A1 * | 10/2005 | Chiola et al. | 257/480 |
| 2006/0071276 A1 * | 4/2006 | Zundel et al. | 257/355 |
| 2006/0273382 A1 * | 12/2006 | Hshieh | 257/330 |
| 2007/0290257 A1 * | 12/2007 | Kraft et al. | 257/330 |
| 2008/0079081 A1 | 4/2008 | Hashimoto | |

FOREIGN PATENT DOCUMENTS

| | | |
|---|---|---|
| DE | 10 2004 022 455 A1 | 11/2004 |
| DE | 103 61 714 A1 | 8/2005 |
| DE | 101 23 818 B4 | 9/2006 |
| EP | 0 621 631 A1 | 10/1994 |
| JP | 60-208855 | 10/1985 |
| JP | 62-032638 A | 2/1987 |
| JP | 63-237458 A | 10/1988 |
| JP | 63-318781 A | 12/1988 |
| JP | 1-166564 A | 6/1989 |
| JP | 2-82034 U | 6/1990 |
| JP | 4-87373 A | 3/1992 |
| JP | 6-302766 A | 10/1994 |
| JP | 7-86587 A | 3/1995 |
| JP | 7-273288 | 10/1995 |
| JP | 8-32057 | 2/1996 |
| JP | 9-219519 A | 8/1997 |
| JP | 11-87612 A | 3/1999 |
| JP | 11-234104 A | 8/1999 |
| JP | 2000-150778 | 5/2000 |
| JP | 2001-44435 | 2/2001 |
| JP | 2002-83964 | 3/2002 |
| JP | 2002-208677 A | 7/2002 |
| JP | 2002-231943 | 8/2002 |
| JP | 2002-246598 | 8/2002 |
| JP | 2002-246599 A | 8/2002 |
| JP | 2003-189593 A | 7/2003 |
| JP | 2003-197914 | 7/2003 |
| JP | 2003-309264 A | 10/2003 |
| JP | 2004-281918 A | 10/2004 |
| JP | 2005-191221 A | 7/2005 |
| JP | 2005-294649 A | 10/2005 |
| KR | 10-2004-0111710 A | 12/2004 |

OTHER PUBLICATIONS

Japanese Office Action issued May 15, 2012 in patent application No. 2007-139509 with English translation.
Office Action issued Jul. 31, 2012 in Japanese Patent Application No. 2007-139509 with English language abstract.
German Office Action Issued May 22, 2013 in Patent Application No. 10 2008 064 686.5 (with English translation).
Office Action issued Dec. 20, 2013, in Chinese Patent Application No. 201210018553.0.
Office Action issued Feb. 4, 2014, in Japanese Patent Application No. 2012-249372 (with English language translation).
Japanese Office Action issued Mar. 10, 2015 in Patent Application No. 2014-077834 (with English Translation).
Office Action mailed Jul. 3, 2015, in Chinese Application No. 201210018553.0, with English translation.

* cited by examiner

SEMICONDUCTOR DEVICE WITH A RESISTANCE ELEMENT IN A TRENCH

BACKGROUND OF THE INVENTION

1. Field of the Invention

The present invention relates to a semiconductor device, and particularly to a semiconductor device including a channel region formed of a part of a semiconductor substrate and an electrode.

2. Description of the Background Art

As semiconductor devices, there are power semiconductor chips such as an IGBT (Insulated Gate Bipolar Transistor) and a power MOSFET (Metal Oxide Semiconductor Field-Effect Transistor). Gates of these semiconductor chips primarily have a plane gate structure or a trench gate structure.

In the prior art, the gate of the trench gate structure is made of e.g., polycrystalline silicon. In recent years, such a method has been proposed that uses metal of a high melting point for lowering a resistivity of the trench gate. According to, e.g., Japanese Patent Laying-Open No. 2001-044435, a polycrystalline silicon layer, i.e., a buffer layer as well as high-melting point metal are formed or arranged in a trench of the trench gate structure.

A resistance element called a gate resistance may be connected to the gate. Although the gate resistance is arranged externally with respect to the semiconductor chip in a conventional structure, it has been proposed in recent years to arrange the gate resistance inside the semiconductor chip.

For example, Japanese Patent Laying-Open No. 2002-083964 has proposed a gate resistance (internal gate resistance) arranged inside a semiconductor chip. According to this publication, the internal gate resistance made of, e.g., polycrystalline silicon stabilizes a switching operation of semiconductor elements connected in parallel.

For example, Japanese Patent Laying-Open No. 2003-197914 has disclosed a semiconductor device in which an internal gate resistance made of, e.g., polycrystalline silicon is arranged under a gate pad, i.e., an exposed portion of a gate external-connection electrode with an interlayer insulating film therebetween. According to this publication, this structure provides a semiconductor device that does not reduce an area of an active region of a semiconductor substrate, has an internal gate resistance of a large area and can suppress a current density of a transitional pulse current.

The above semiconductor device having the external gate resistance suffers from a problem of increase in number of parts. Also, a potential of connection between the gate resistance and the semiconductor chip is liable to change due to external noises, and this potential change directly affects the gate in the semiconductor chip without mediation of a gate resistance. This results in a problem in that the semiconductor device is liable to malfunction or oscillate.

For example, when hundreds to tens of thousands of gates in an IGBT may be supplied with currents, a large current flows through a gate resistance. In this case, a current path of the gate resistance must have a large sectional area for ensuring reliability. In the semiconductor device of Japanese Patent Laying-Open No. 2002-083964 described above, it is necessary to increase a width or a thickness of the internal gate resistance. However, increase in thickness results in problems that a long time is required for depositing a film forming the internal gate resistance, and that processing or working of the film thus deposited is difficult. Also, increase in width results in a problem that areas of the internal gate resistance and therefore the semiconductor chip increase.

According to the internal gate resistance of Japanese Patent Laying-Open No. 2003-197914 described above, an area of the semiconductor chip can be reduced because the gate pad and the internal gate resistance overlap each other, but the area can be reduced only by an area of the gate pad at the most.

SUMMARY OF THE INVENTION

An object of the invention is to provide a semiconductor device having a resistance element that has a small footprint and can pass a large current with high reliability.

Another object of the invention is to provide a semiconductor device having a resistance element that has a controllable resistance value.

Still another object of the invention is to provide a semiconductor device that has a plurality of gate electrodes, and suppresses a difference in transmission delay between potential signals transmitted to the respective gate electrodes.

Yet another object of the invention is to provide a semiconductor device that has a shunt resistance and is further reduced in size.

Further another object of the invention is to provide a semiconductor device that has an interconnection of a small parasitic resistance.

A semiconductor device of the invention includes a semiconductor substrate, an insulating film, a semiconductor element and a resistance element. The semiconductor substrate has a first trench. The insulating film covers an inner surface of the first trench. The semiconductor element has an electrode. The resistance element is electrically connected to the electrode to form a resistance to a current flowing through the electrode, and is arranged in the first trench with the insulating film therebetween.

A semiconductor device may have the following features.

A semiconductor device according to an aspect of the invention includes a semiconductor substrate, an insulating film, a semiconductor element and a resistance element. The insulating film covers at least a part of the semiconductor substrate. The semiconductor element has an electrode. The resistance element is electrically connected to the electrode to form a resistance to a current flowing through the electrode, and is arranged on the semiconductor substrate with the insulating film therebetween. A potential difference between the semiconductor substrate and the resistance element produces a depletion layer in the resistance element.

A semiconductor device according to another aspect has a semiconductor substrate, a semiconductor element, an insulating film and at least one diode. The semiconductor element has an electrode. The insulating film covers at least a part of the semiconductor substrate. The diode is arranged on the insulating film, and is electrically connected to the electrode to form a resistance to a current flowing through the electrode.

A semiconductor device according to still another aspect of the invention includes a semiconductor substrate, a semiconductor element, an insulating film and at least one junction field-effect transistor. The semiconductor substrate has a first trench.

The semiconductor element has an electrode. The insulating film covers at least a part of the semiconductor substrate. The junction field-effect transistor is arranged on the insulating film and has a source and a drain.

A semiconductor device according to yet another aspect of the invention includes a semiconductor substrate, a semiconductor element, an insulating film and at least one MIS field-effect transistor. The semiconductor element has an electrode. The insulating film covers at least a part of the semiconductor substrate. The MIS field-effect transistor is arranged on the insulating film, and has a source and a drain. One of the source and the drain is electrically connected to the electrode to form a resistance to a current flowing through the electrode.

A semiconductor device according to further another aspect of the invention includes a semiconductor substrate, a semiconductor element, an insulating film and a resistance element. The semiconductor element has an electrode. The insulating film covers at least a part of the semiconductor substrate. The resistance element is arranged on the insulating film, is electrically connected to the electrode to form a resistance to a current flowing through the electrode and includes at least one region having a diode and an ohmic resistance in parallel.

A semiconductor device according to a further aspect of the invention includes a semiconductor substrate, a semiconductor element, a gate pad, a gate interconnection and a plurality of resistance elements. The semiconductor element has a channel region formed of a part of the semiconductor substrate, and a plurality of gate electrodes for controlling the channel region. The gate pad is electrically connected to the plurality of gate electrodes. The gate interconnection electrically connects at least one of the plurality of gate electrodes to the gate pad. The resistance elements are arranged at a midpoint of the gate interconnection. The resistance element connected to the gate electrode relatively near the gate pad has a larger resistance value than the resistance element connected to the gate electrode relatively remote from the gate pad.

A semiconductor device according to a further aspect of the invention includes a semiconductor substrate, a semiconductor element, an insulating film and first and second resistance elements. The semiconductor element has one of a first emitter electrode and a first source electrode, one of a second emitter electrode and a second source electrode, and a gate electrode. The insulating film covers at least a part of the semiconductor substrate. The first resistance element is arranged on the insulating film, and electrically connects one of the first emitter electrode and the first source electrode to one of the second emitter electrode and the second source electrode. The second resistance element is arranged on the insulating film, and electrically connects one of the first emitter electrode and the first source electrode to the gate electrode with an electric resistance corresponding to a potential of one of the second emitter electrode and the second source electrode.

A semiconductor device according to a further aspect of the invention includes a semiconductor substrate, a semiconductor element, an insulating film, and first and second interconnections. The semiconductor substrate has a trench. The semiconductor element has a channel region formed of a part of the semiconductor substrate, and an electrode. The insulating film covers an inner surface of the trench. The first interconnection is electrically connected to the electrode, and is arranged in the trench with the insulating film therebetween. The second interconnection is arranged on the trench, and is connected electrically in parallel to the first interconnection.

According to the semiconductor device of the invention, the resistance element is arranged in the first trench. This can reduce a footprint of the resistance element that can pass a large current with high reliability.

In the semiconductor device according to the foregoing aspect of the invention, the resistance element includes the semiconductor region. The resistance value of the resistance element can be controlled by using semiconductor characteristics of this semiconductor region.

In the semiconductor device according to the foregoing aspect of the invention, the resistance element connected to the gate electrode relatively near the gate pad has a larger resistance value than the resistance element connected to the gate electrode relatively remote from the gate pad. This structure can suppress a difference in transmission delay between potential signals transmitted to the respective gate electrodes.

In the semiconductor device according to the foregoing aspect of the invention, the first resistance element electrically connecting one of the first emitter electrode and the first source electrode to one of the second emitter electrode and the second source electrode is arranged on the insulating film. This can reduce sizes of the semiconductor device having a shunt resistance.

In the semiconductor device according to the further aspect of the invention, the first interconnection arranged in the trench and the second interconnection arranged on the trench are connected in parallel. Thereby, the parasitic resistance of the interconnection can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described with reference to the drawings.

First Embodiment

First, a schematic structure of a semiconductor device of a first embodiment will be described.

Figure 1A:
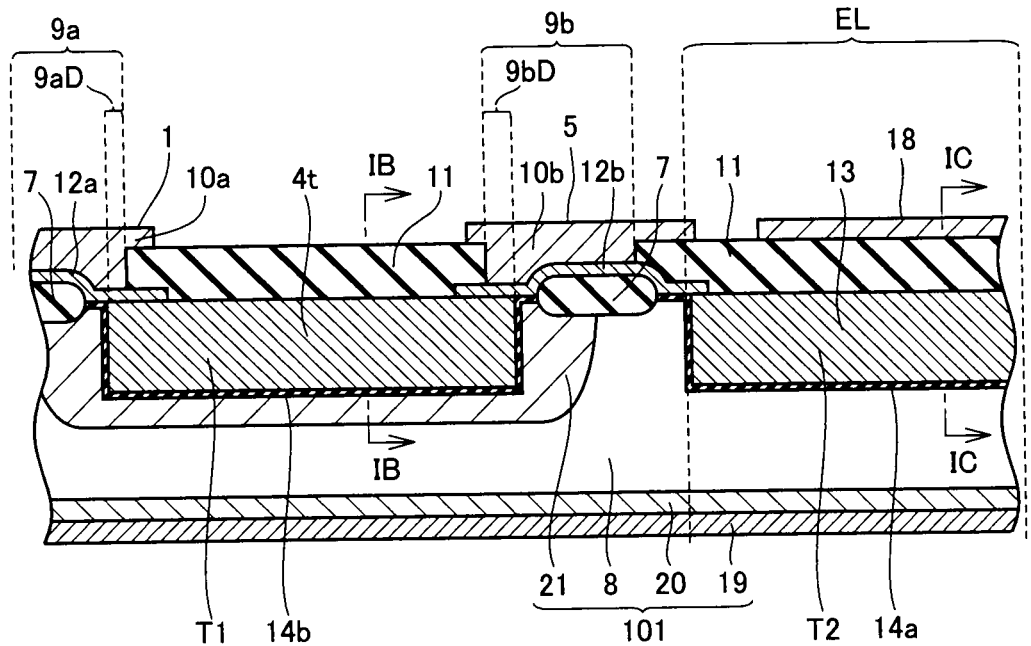
FIGS. 1A-1C are fragmentary sections schematically showing a semiconductor device according to a first embodiment of the invention.
Figure 1B:
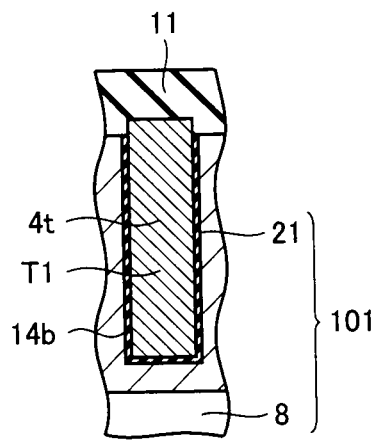
Figure 1C:
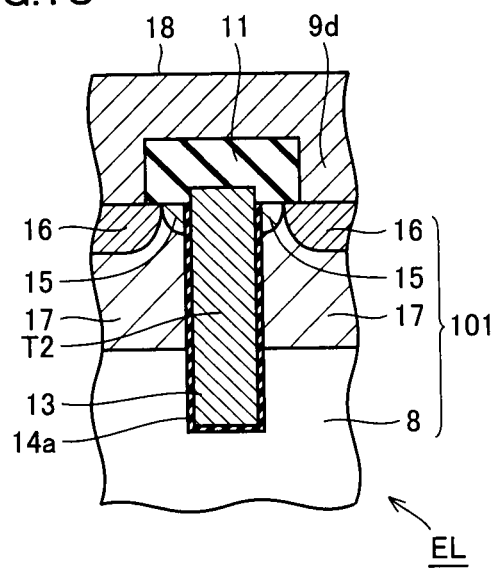

Referring to FIGS. 1A-1C, an IGBT chip of this embodiment is a power semiconductor device, and has an IGBT element EL that is a trench gate type semiconductor element, and a trench type internal gate resistance 4t that is a resistance element.

Referring to FIGS. 1A and 1B, trench type internal gate resistance 4t is formed in a first trench T1 formed at a semiconductor substrate 101 with an insulating film 14b therebetween. Thereby, trench type internal gate resistance 4t is configured such that a sectional area of its current path increases with increase in depth of first trench T1.

Referring to FIGS. 1A and 1C, IGBT element EL has a channel region formed of a part of semiconductor substrate 101. IGBT element EL has a large number of gate electrodes 13 for controlling the channel region. Gate electrodes 13 are, e.g., hundreds to tens of thousands in number.

Referring to FIGS. 1A-1C and 2, gate electrodes 13 of respective cells of IGBT element EL are electrically connected together by a gate main interconnection 5. Gate main interconnection 5 is electrically connected to a peripheral portion of a gate pad 1 via trench type internal gate resistance 4t.

Thereby, the IGBT chip is configured to transmit an input provided to gate pad 1 to each gate electrode 13 of IGBT element EL via trench type internal gate resistance 4t. Thus, trench type internal gate resistance 4t is electrically connected to gate electrode 13 such that trench type internal gate resistance 4t forms a resistance (gate resistance) to a current flowing through gate electrode 13. This gate resistance primarily has functions of delaying a potential transmitted to gate electrode 13 and adjusting rising of current/voltage at the time of switching of IGBT element EL.

Gate main interconnection 5 has a polycrystalline silicon layer 12b made of n-type polycrystalline silicon that is a gate material heavily doped with impurities. Gate main interconnection 5 has a main interconnection metal layer 10b for reducing a resistance of the interconnection. In a contact hole 9b on a main interconnection side, polycrystalline silicon layer 12b and main interconnection metal layer 10b are in contact with each other and are electrically connected together.

Specific structures of the semiconductor device of the embodiment will now be described.

Referring to FIG. 1A again, the IGBT chip has semiconductor substrate 101 as a base. The IGBT chip has IGBT element EL including a part of semiconductor substrate 101. The IGBT chip has insulating film 14b, trench type internal gate resistance 4t, a field oxide film 7, polycrystalline silicon layers 12a and 12b, an interlayer insulating film 11, a gate pad metal layer 10a and main interconnection metal layer 10b.

Field oxide film 7 isolates semiconductor substrate 101 from polycrystalline silicon layers 12a and 12b, and is formed, e.g., by an LOCOS (Local Oxidation of Silicon) method. Gate pad metal layer 10a and main interconnection metal layer 10b are made of, e.g., a conductive material of a low resistance such as aluminum alloy.

Figure 7:
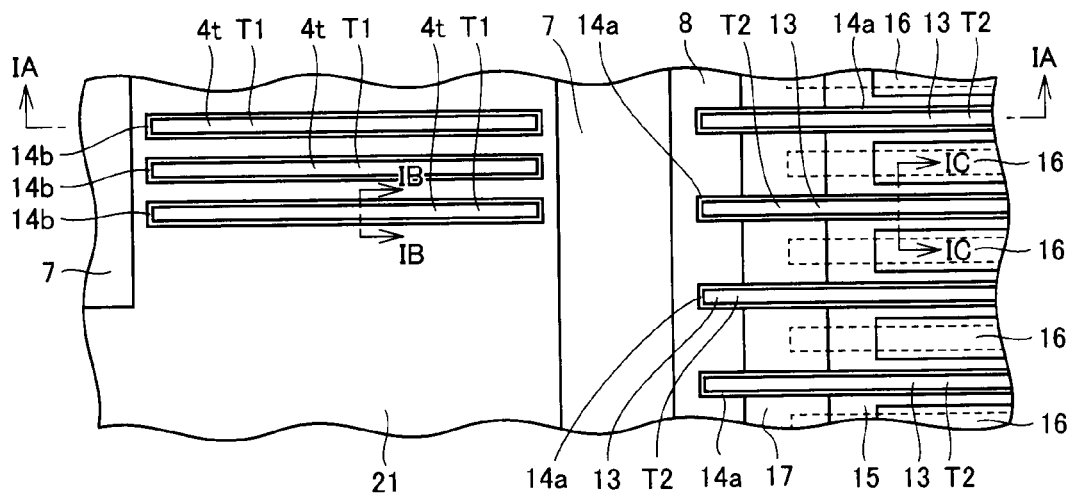
FIG. 7 corresponds to FIG. 6, except that a part of a gate oxide film and a part of an insulating film in FIG. 6 are not shown.

Referring primarily to FIGS. 1A, 1B and 7, semiconductor substrate 101 has first trench T1 having an inner surface covered with insulating film 14b. Thus, insulating film 14b covers bottom and side surfaces of first trench T1. Insulating film 14b electrically isolates semiconductor substrate 101 from trench type internal gate resistance 4t arranged in first trench T1.

For example, first trench T1 has a depth (a longitudinal size in FIG. 1A) of about 10 μm and a width (a lateral size in FIG. 1B) of about 1.2 μm, and is configured such that the plurality of first trenches T1 extend in parallel with a pitch of 2.5 μm as shown in FIG. 7. Insulating film 14b has a film thickness that is small as compared with the sizes of first trench T1 and is, e.g., in a range from tens of micrometers to two hundred micrometers.

Since there is no complicated structure between neighboring trench type internal gate resistances 4t, the pitch of trenches (first trenches T1) for trench type internal gate resistances 4t may be smaller than the pitch of trenches (second trenches T2) for gate electrodes 13. Thus, the pitch of first trenches T1 may be small and is equal to, e.g., about 2.5 μm.

Figure 6:
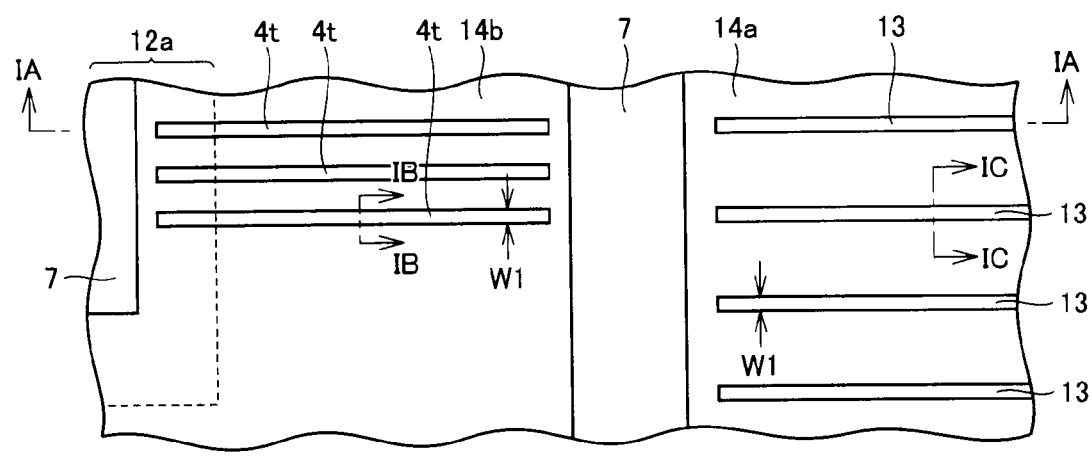
FIG. 6 corresponds to FIG. 5, except that polycrystalline silicon layers on a gate pad side and a main interconnection side in FIG. 5 are not shown.

Trench type internal gate resistance 4t is made of a material that is used as an electric resistor and, for example, is made of n-type polycrystalline silicon that is heavily doped at $1 \times 10^{19}/cm^3$ or higher. Trench type internal gate resistance 4t has a width, e.g., equal to a width W1 (FIG. 6) of gate electrode 13, and has a function exerting a resistance to a current flowing in a lengthwise direction (i.e., lateral direction in FIG. 6). Trench type internal gate resistance 4t has a depth (i.e., longitudinal size in FIGS. 1A and 1B), e.g., in a range from 5 μm to 20 μm.

Trench type internal gate resistance 4t has a resistance value that depends on the size of the trench filled with trench type internal gate resistance 4t, and also depends on a doping concentration of the n-type polycrystalline silicon filling the trench. This resistance value is in a range, e.g., from hundreds of ohms to several kilohms per length of 1 mm of trench type internal gate resistance 4t.

One trench type internal gate resistance 4t has reliability that allows passing of a current in a range from tens to hundreds of milliamperes. One trench type internal gate resistance 4t has a resistance value of 1 kΩ per length of 1 mm, and has reliability allowing passing of a current of up to 200 mA. The resistance of 8Ω passing the current of up to 5 A can be achieved by connecting twenty-five trench type internal gate resistances 4t each having a length of 200 μm in parallel.

Referring to FIGS. 1A and 1B, trench type internal gate resistance 4t filling first trench T1 is covered with interlayer insulating film 11 located on an opening side of first trench T1. Interlayer insulating film 11 is provided with a contact hole 9a on the gate pad side and contact hole 9b on the main interconnection side.

In gate pad side contact hole 9a, gate pad metal layer 10a is connected to trench type internal gate resistance 4t via polycrystalline silicon layer 12a. In main interconnection side contact hole 9b, main interconnection metal layer 10b is connected to trench type internal gate resistance 4t via polycrystalline silicon layer 12b.

Figure 3:
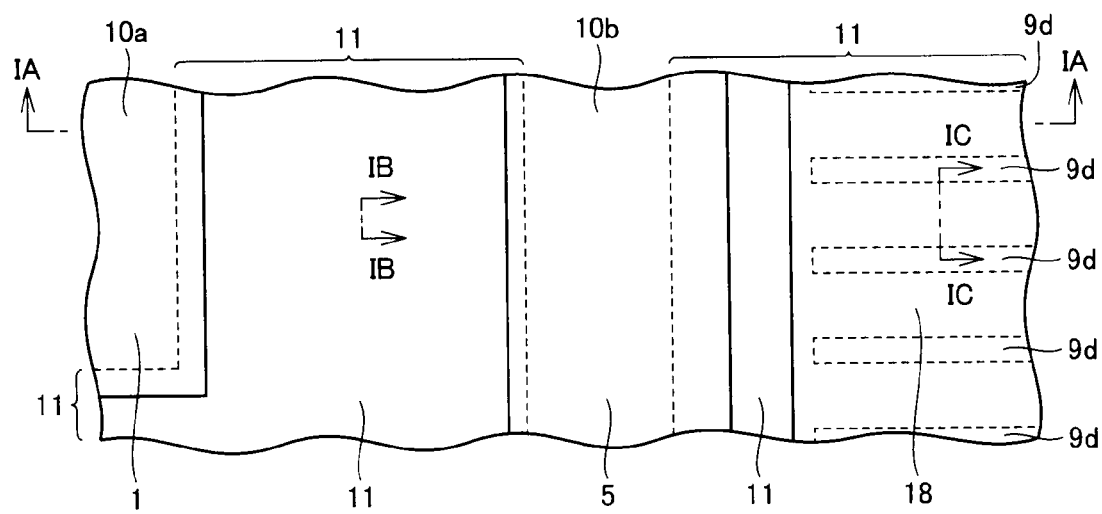
FIG. 3 is a fragmentary top view schematically showing a portion indicated by III in FIG. 2.

Referring to FIGS. 1A and 3, gate pad metal layer 10a has a top side having a function as gate pad 1. More specifically, the top side of gate pad metal layer 10a is configured to allow connection to an external interconnection by wire bonding or the like. Main interconnection metal layer 10b forms gate main interconnection 5 together with polycrystalline silicon layer 12b.

Referring to FIG. 1A, in the region where IGBT element EL is formed, the IGBT chip is provided with semiconductor substrate 101, a gate insulating film 14a, gate electrode 13, polycrystalline silicon layer 12b, interlayer insulating film 11 and an emitter pad 18.

Figure 2:
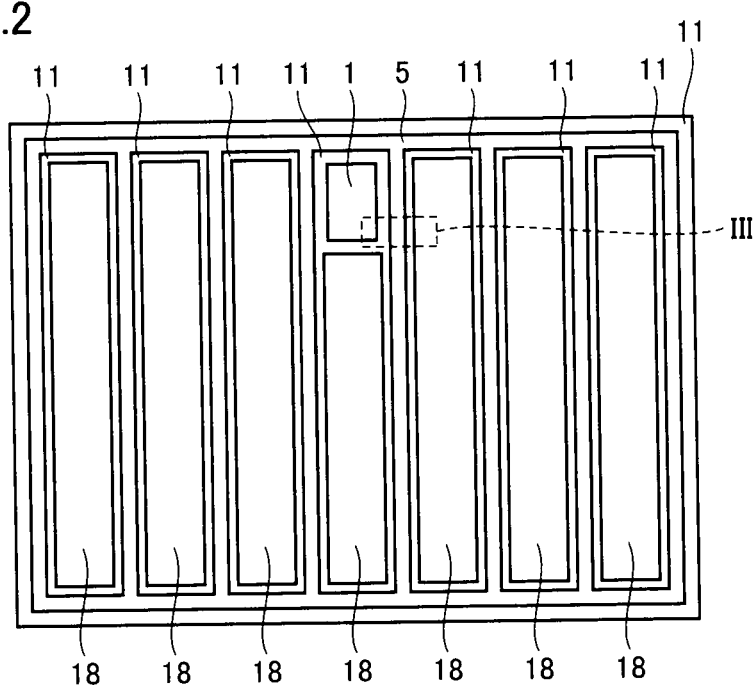
FIG. 2 is a top view schematically showing a structure of the semiconductor device according to the first embodiment of the invention.

Referring to FIG. 2, in a region where emitter pad 18 is formed, IGBT element EL has a structure formed of, e.g., hundreds of to tens of thousands of cells. Each of IGBT element EL has gate electrode 13.

Referring to FIGS. 1A, 1C and 7, semiconductor substrate 101 has an n-type emitter region 15, a heavily doped p-type region 16, a p-type channel region 17, a lightly doped n-type drift region 8, an n-type buffer region 20 and a p-type collector region 19.

Semiconductor substrate 101 has second trench T2 having an inner surface covered with gate insulating film 14a. Thus, gate insulating film 14a covers bottom and side surfaces of second trench T2. Gate insulating film 14a electrically isolates gate electrode 13 arranged in second trench T2 from semiconductor substrate 101.

For example, second trench T2 has a depth (a longitudinal size in FIG. 1A) of about 10 μm and a width (a lateral size in FIG. 1C) of about 1.2 μm, and is configured such that the plurality of second trenches T2 extend in parallel with a pitch of 5.0 μm as shown in FIG. 7. Gate insulating film 14a has a film thickness that is small as compared with the sizes of second trench T2 and is, e.g., in a range from tens of micrometers to two hundred micrometers. Gate electrode 13 is made of, e.g., n-type polycrystalline silicon that is heavily doped at $1 \times 10^{19}/cm^3$ or higher.

Figure 5:
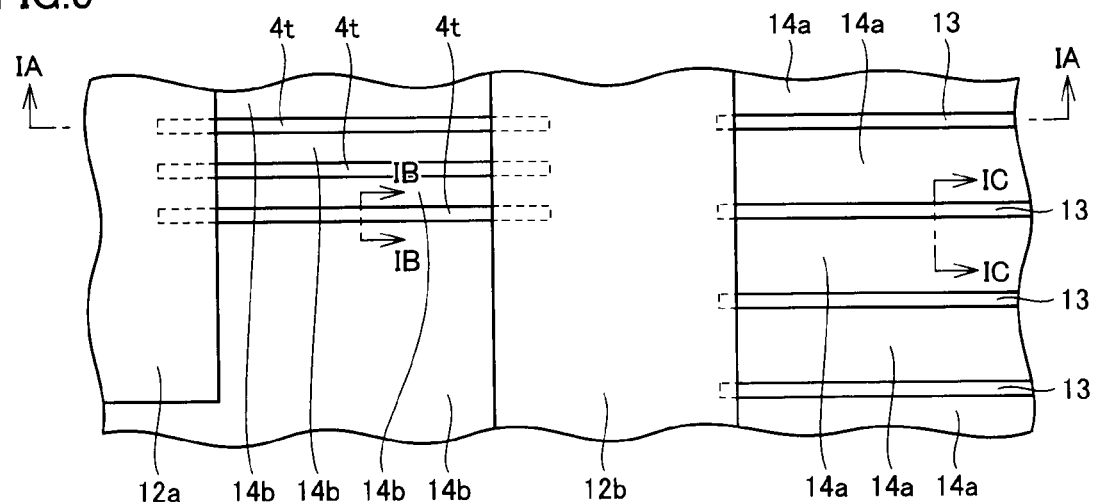
FIG. 5 corresponds to FIG. 4, except that an interlayer insulating film in FIG. 4 is not shown.

Referring to FIGS. 1A, 1C and 5, gate electrode 13 is in contact with polycrystalline silicon layer 12b. Thereby, gate electrode 13 is connected to gate main interconnection 5.

Referring to FIGS. 1A and 1C, gate electrode 13 filling second trench T2 is covered with interlayer insulating film 11 on the opening side of second trench T2.

Figure 4:
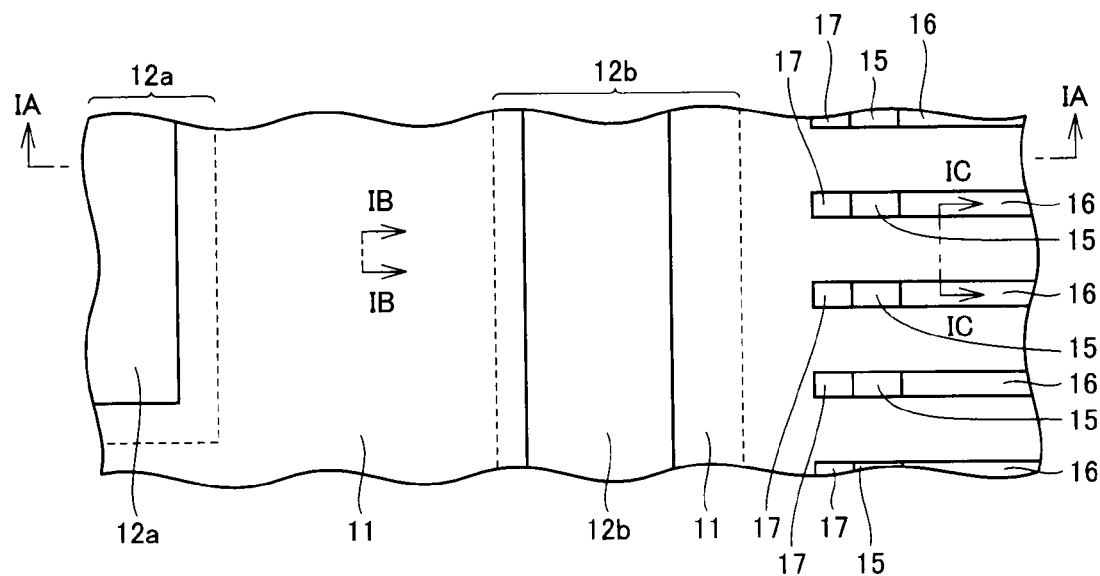
FIG. 4 corresponds to FIG. 3, except that a gate pad, a gate main interconnection and an emitter pad (emitter electrode) in FIG. 3 are not shown.

Referring to FIGS. 3 and 4, interlayer insulating film 11 is provided with an emitter contact hole 9d (i.e., contact hole for an emitter), through which emitter pad (emitter electrode) 18 is connected to n-type emitter region 15, heavily doped p-type region 16 and p-type channel region 17.

In the above structure, as shown in FIG. 1A, contact hole 9a on the gate pad side preferably has a region overlapping a surface of trench type internal gate resistance 4t on the opening side of first trench T1. Thus, interlayer insulating film 111 has a gate pad side contact hole 9aD that forms a part of gate pad side contact hole 9a and is located on the opening side of first trench T1 of trench type internal gate resistance 4t.

Contact hole 9b on the main interconnection side has a region overlapping a surface of trench type internal gate resistance 4t on the opening side of first trench T1. Thus, interlayer insulating film T1 has a main interconnection side contact hole 9bD that forms a part of main interconnection side contact hole 9b and is located on the opening side of first trench T1 of trench type internal gate resistance 4t.

As shown in FIGS. 1A and 2, interlayer insulating film 11 isolates gate pad 1 from gate main interconnection 5, and a current path between gate pad 1 and gate electrode 13 is substantially formed of only a current path extending through trench type internal gate resistance 4t. The current path thus formed includes neither a current path caused by a parasitic capacitance or a parasitic inductance nor a path of a minute current flowing through an insulator.

As shown in FIGS. 1A-1C and 7, semiconductor substrate 101 includes a p-type region 21 that is in contact with insulating film 14b and has a conductivity type opposite to that of lightly doped n-type drift region 8 of IGBT element EL. More preferably, p-type region 21 is doped with impurities for achieving the conductivity type opposite to that of lightly doped n-type drift region 8, and the concentration of these impurities is higher than that of impurities with which p-type channel region 17 of IGBT element EL is doped for achieving the conductivity type opposite to that of lightly doped n-type drift region 8.

The potential of p-type region 21 is controlled so that an inversion layer may not be formed in p-type region 21. For this control, p-type region 21 is electrically connected, e.g., to n-type emitter region 15 of IGBT element EL.

A method of using the IGBT chip according to the embodiment will now be described.

Figure 8:
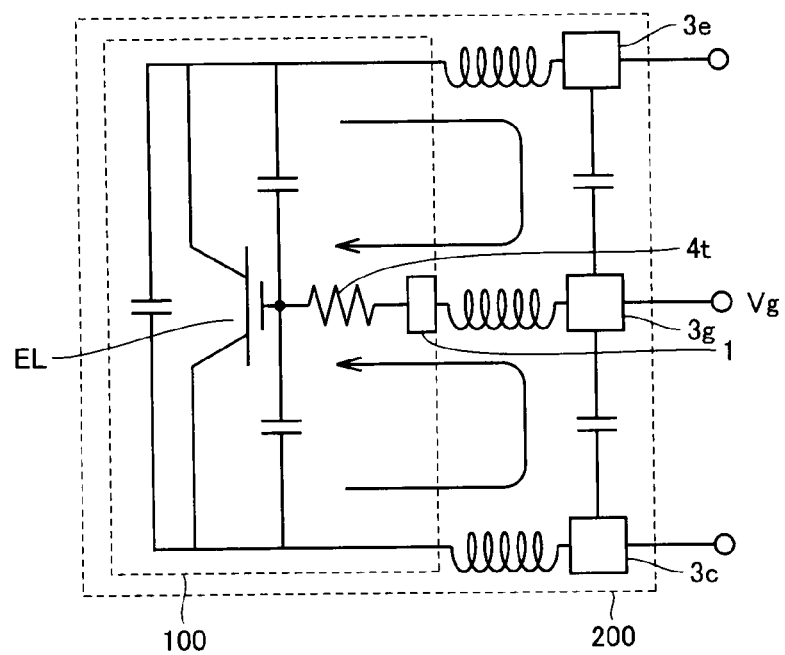
FIG. 8 schematically shows an equivalent circuit in a state where the semiconductor device of the first embodiment of the invention is arranged on a printed board.
Figure 9:
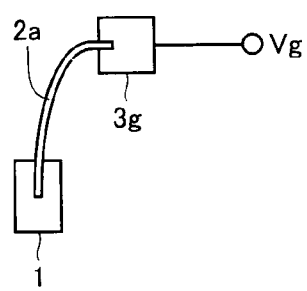
FIG. 9 schematically illustrates a state of connection between a gate pad of the semiconductor device and a pad of the printed board in the first embodiment of the invention.

Referring to FIGS. 8 and 9, a circuit 100 of the IGBT chip is incorporated, e.g., into a circuit 200 of a printed board for use. The printed board has an external emitter pad 3e, an external gate pad 3g and an external collector pad 3c, which are made of a conductive material of a low resistance such as gold.

Gate pad 1 of the IGBT chip is connected to external gate pad 3g of the printed board via a wire 2a made of aluminum or gold. Emitter region 15 (FIG. 1C) and p-type collector region 19 (FIG. 1A) of the IGBT chip are electrically connected to external emitter pad 3e and external collector pad 3c, respectively. A potential $V_g$ is externally applied to external gate pad 3g.

In FIG. 8, symbols of capacitors and coils represent parasitic capacitances and parasitic inductances in the IGBT chip, respectively. Arrows in FIG. 8 represent paths which feed back the outputs from the collector and emitter of IGBT element EL to the gate electrode via the parasitic capacitances and parasitic inductances.

The semiconductor device of this embodiment can be manufactured by a method that is substantially the same as that of a semiconductor device of a second embodiment to be described layer, except for that a part of the method is simplified in the first embodiment.

A modification of the structure of trench type internal gate resistance 4t in this embodiment will now be described.

Figure 10:
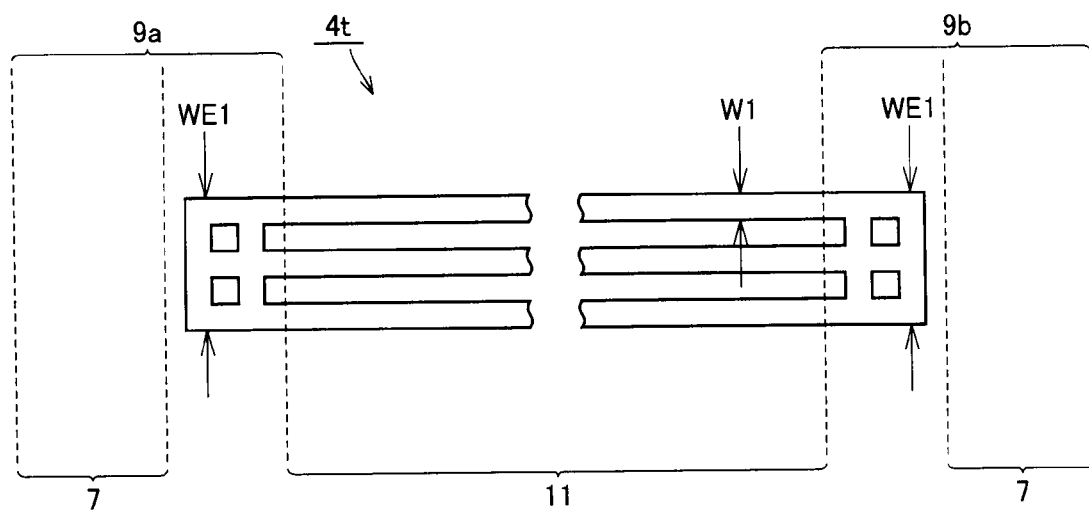
FIG. 10 is a plan view schematically showing a structure of a resistance element in a modification of the semiconductor device of the first embodiment of the invention.
Figure 11:
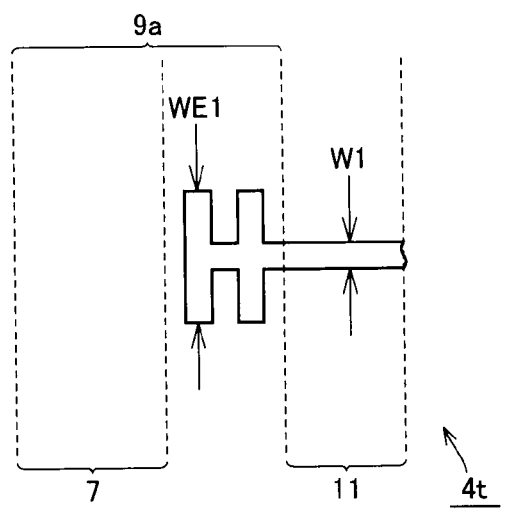
FIGS. 11-15 are fragmentary plan views schematically showing structures of resistance elements in modifications of the semiconductor device of the first embodiment of the invention, respectively.
Figure 12:
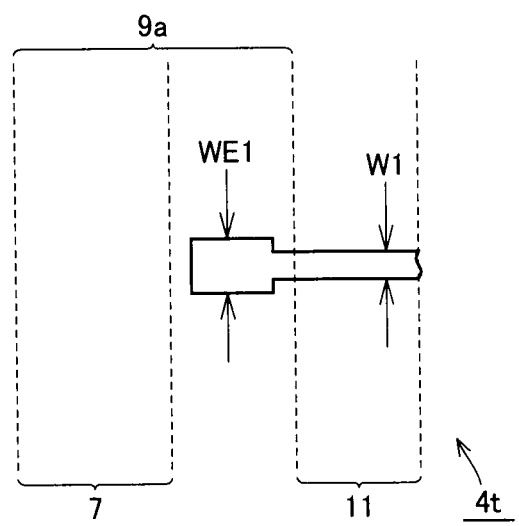
Figure 13:
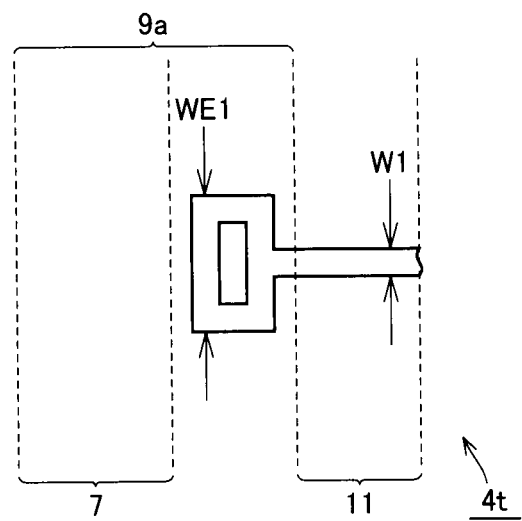
Figure 14:
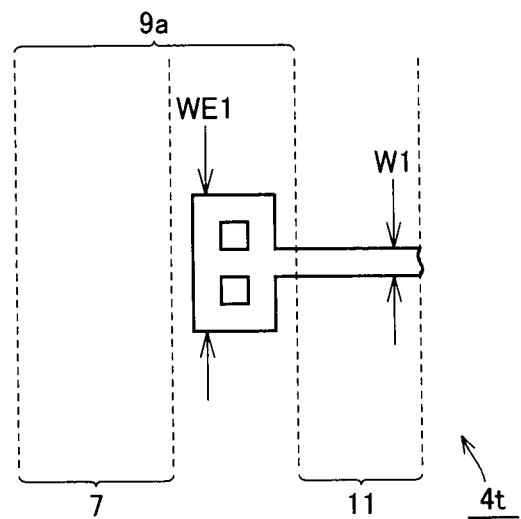
Figure 15:
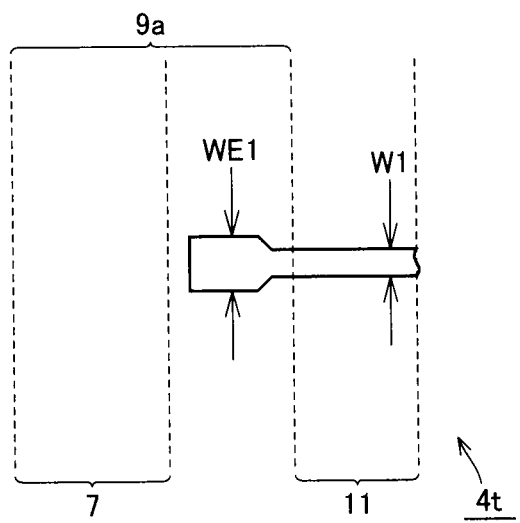

Referring to FIG. 10, trench type internal gate resistance 4t includes a portion that is opposed to contact hole 9a on the gate pad side, and this portion has a width WE1 larger than width W1 equal to a minimum width of a portion opposed to interlayer insulating film 11. Also, trench type internal gate resistance 4t includes a portion opposed to contact hole 9b on the main interconnection side, and this portion has width WE1 larger than width W1, i.e., the minimum width of the portion opposed to interlayer insulating film 11.

In this modification, trench type internal gate resistance 4t may have a form other than that shown in FIG. 10 and, for example, may selectively have forms in FIGS. 11 to 15. Although FIGS. 11 to 15 show structures of trench type internal gate resistance 4t near a portion opposed to contact hole 9a on the gate pad side, the portion opposed to contact hole 9b on the main interconnection side may have substantially the same structure.

A first comparison example will now be described.

Figure 16:
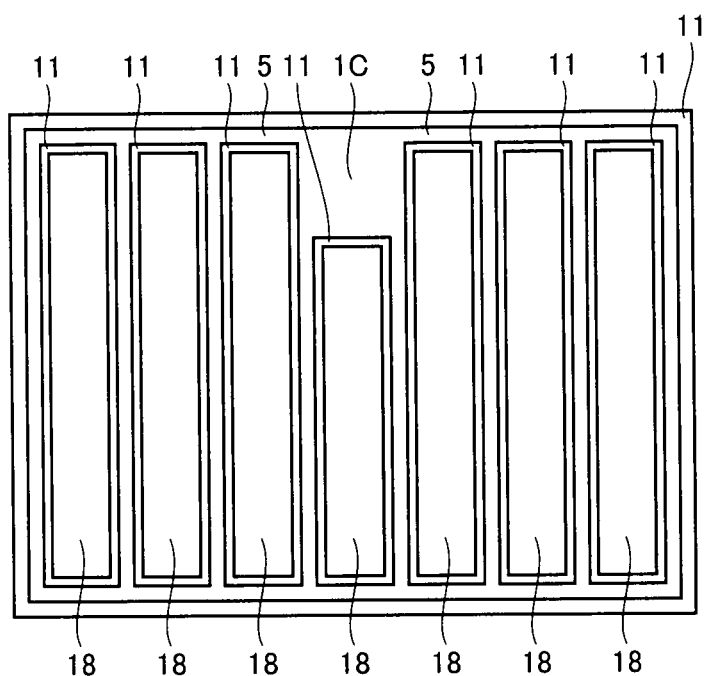
FIG. 16 is a top view schematically showing a structure of a semiconductor device in a first comparison example.

First, a structure of a semiconductor device of this comparison example will be described. Referring to FIG. 16, an IGBT chip that is the semiconductor device of this comparison example has a gate pad 1C and gate main interconnection 5 that are integral with each other. Since gate pad 1C and gate main interconnection 5 are integral with each other, a resistance element serving as a gate resistance is not present between them.

Figure 17:
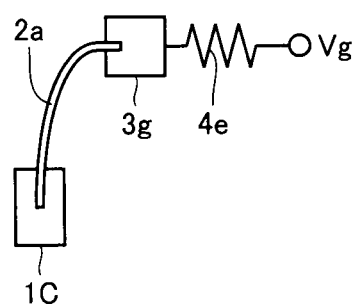
FIG. 17 schematically illustrates a state of connection between a gate pad of the semiconductor device and a pad of a printed board in the first comparison example.

Referring to FIG. 17, an external gate resistance 4e is prepared as a part or component independent of the IGBT chip, and is connected to external gate pad 3g. External gate pad 3g is externally supplied with a potential $V_g$ via external gate resistance 4e for controlling the potential of the gate electrode.

Figure 18:
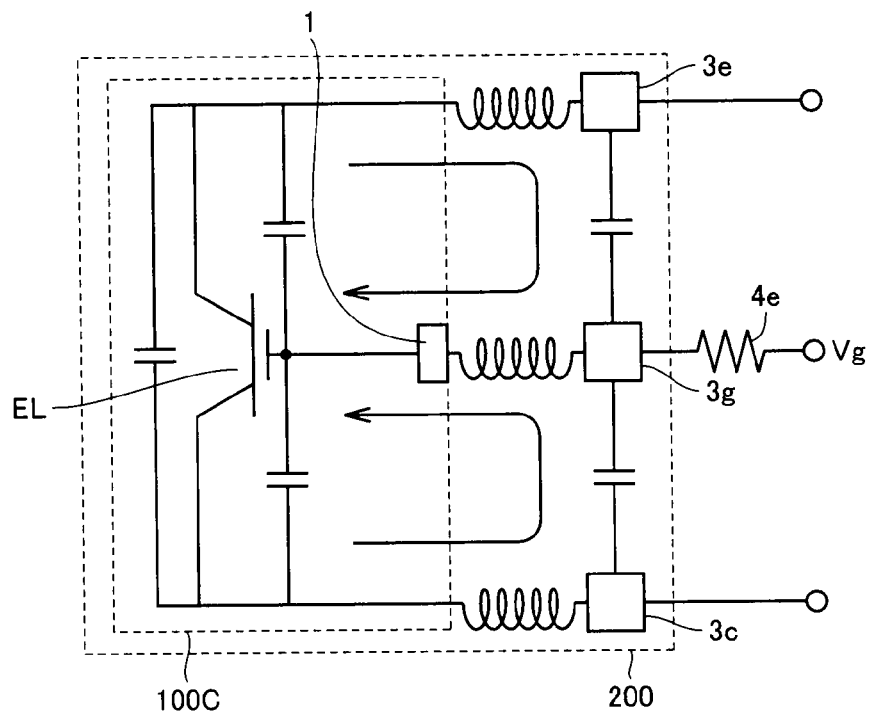
FIG. 18 shows an equivalent circuit of the semiconductor device arranged on the printed board in the first comparison example.

Referring to FIG. 18, symbols of capacitors and coils represent parasitic capacitances and parasitic inductances in a circuit 100C of the IGBT chip, respectively. Arrows in FIG. 18 represent paths which feed back the outputs from the collector and emitter of IGBT element EL to the gate electrode via the parasitic capacitances and parasitic inductances.

External gate resistance 4e is not arranged between the gate electrode of IGBT element EL and external gate pad 3g. Thus, external gate resistance 4e is not present on the paths that feed back the outputs from the collector and emitter of IGBT element EL to the gate electrode.

Therefore, when the potential of external gate pad 3g changes due to external noises, this change in potential is directly transmitted to the gate electrode of IGBT element EL via the parasitic inductance. Consequently, noises are liable to affect the gate electrode.

When the above change returns to the gate electrode of IGBT element EL operating as an amplifier via the paths indicated by the arrows in the figure, a value of Q represented by the following equation increases.

$$Q = \sqrt{\frac{C}{L}} \cdot \frac{1}{R}$$

Therefore, oscillations are liable to occur in a gate-emitter voltage $V_{ge}$, a collector-emitter voltage $V_{ce}$, a collector current $I_c$ and the like. In the above formula, L indicates a parasitic inductance, C indicates a parasitic capacitance and R indicates a gate resistance.

Then, a second comparison example will be described.

Figure 19:
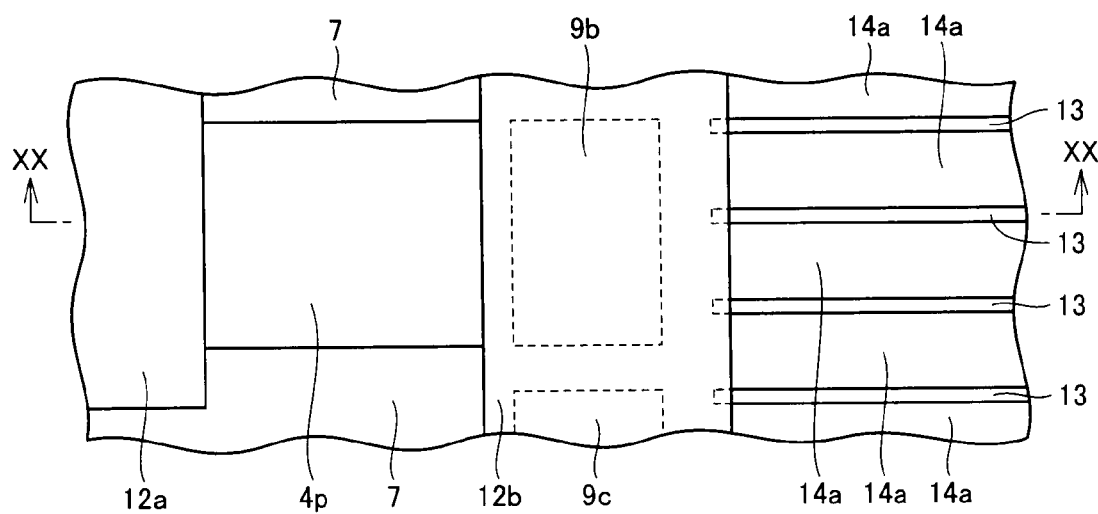
FIG. 19 is a schematic fragmentary plan view of a semiconductor device in a second comparison example. The area shown in FIG. 19 corresponds to that shown in FIG. 5. A gate pad, a gate main interconnection, an emitter pad and an interlayer insulating film are not shown similarly to FIG. 5.
Figure 20:
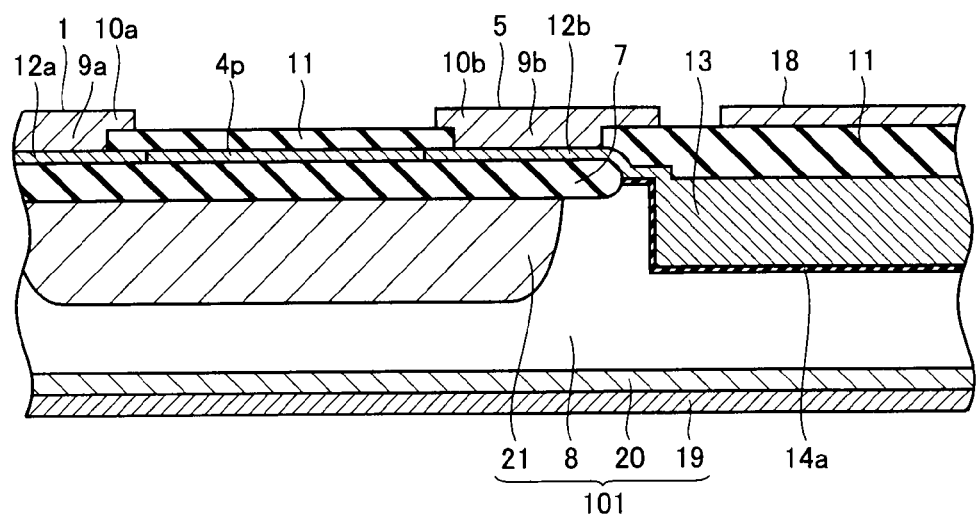
FIG. 20 is a schematic cross section taken along line XX-XX in FIG. 19.

Referring to FIGS. 19 and 20, the IGBT chip that is the semiconductor device of this comparison example has a plane type internal gate resistance 4p that is located between gate pad 1 and gate main interconnection 5, and serves as a gate resistance. Plane type internal gate resistance 4p is a resistance element of a plane type that is arranged on field oxide film 7, and has a surface parallel to a the substrate surface of semiconductor substrate 101. Plane type internal gate resistance 4p is formed by patterning a polycrystalline silicon film that has a film thickness, e.g., of about hundreds of nanometers.

When currents are supplied to hundreds of to tens of thousands of gate electrodes 13 of IGBT element EL, plane type internal gate resistance 4p must have reliability for withstanding a large current. Therefore, the sectional area of the current path is increased for preventing excessive increase in current density. For increasing the sectional area, it is necessary to increase the film thickness (i.e., longitudinal size in FIG. 20) of plane type internal gate resistance 4p or to increase the width (i.e., longitudinal size in FIG. 19) thereof.

For increasing the film thickness, a long process time is required for film formation. For example, several hours are required for depositing the polycrystalline silicon to a thickness of hundreds of nanometers, i.e., the thickness of plane type internal gate resistance 4p that is usually used. For increasing the film thickness to several micrometers, the deposition time of tens of hours is required, and this increases the manufacturing cost. When the polycrystalline silicon film increases, it becomes difficult to ensure a focal depth in a photoengraving process for patterning and to remove residues at a step (i.e., a portion having a difference in level) in an etching process.

When plane type internal gate resistance 4p has a large width, plane type internal gate resistance 4p occupies a large area on the substrate surface of semiconductor substrate 101, which conflicts with a demand for size reduction of the semiconductor device.

Referring to FIG. 20, field oxide film 7 arranged under plane type internal gate resistance 4p usually has a thickness of about 1 μm or more. Since field oxide film 7 has a low thermal conductivity because it is an oxide film. Thus, a thick film of a small thermal conductivity is formed under plane type internal gate resistance 4p. This structure prevents the heat radiation from plane type internal gate resistance 4p, and raises a temperature of plane type internal gate resistance 4p so that the resistance value is liable to change due to temperature dependence.

According to the embodiment, gate electrode 13 of IGBT element EL is electrically connected to trench type internal gate resistance 4t. Thereby, trench type internal gate resistance 4t can function as a gate resistance of gate electrode 13.

As shown in FIGS. 1A and 1B, trench type internal gate resistance 4t is arranged in first trench T1. By increasing the depth of first trench T1, therefore, it is possible to increase the size in the depth direction of trench type internal gate resistance 4t. Therefore, it is possible to reduce the current density of trench type internal gate resistance 4t while keeping a small footprint (an area in FIG. 6) of trench type internal gate resistance 4t on the substrate surface of semiconductor substrate 101, and the reliability of trench type internal gate resistance 4t can be increased.

As shown in FIG. 8, gate pad 1 is connected to gate electrode 13 via trench type internal gate resistance 4t. Therefore, the changes in potential caused by noises that are applied to gate pad 1 and external gate pad 3g connected to gate pad 1 are suppressed by trench type internal gate resistance 4t when such potential changes are transmitted to gate electrode 13.

Preferably, a current path between gate pad 1 and gate electrode 13 is substantially formed of only a current path extending through trench type internal gate resistance 4t. Therefore, there is no current path that bypasses trench type internal gate resistance 4t, and it is possible to prevent lowering of the substantial gate resistance and a failure in the IGBT chip due to such a bypassing current path.

As shown in FIG. 1A, interlayer insulating film 11 has gate pad side contact hole 9aD on the opening side of first trench T1 of trench type internal gate resistance 4t. This structure ensures a wide electric path between gate pad 1 and trench type internal gate resistance 4t, and can prevent deterioration of reliability due to current concentration.

As shown in FIG. 1A, interlayer insulating film 111 has main interconnection side contact hole 9bD located on the opening side of first trench T1 and on the opening side of first trench T1 of trench type internal gate resistance 4t. This ensures a wide electric path between gate main interconnection 5 and trench type internal gate resistance 4t, and can prevent deterioration of the reliability due to current concentration.

As shown in FIGS. 1A and 1C, since gate electrode 13 is arranged in second trench T2, gate electrode 13 can have a trench gate structure. Since second trench T2 can be formed simultaneously with first trench T1, the process cost for forming the trench gates can be suppressed.

As shown in FIGS. 1A and 1B, semiconductor substrate 101 includes a p-type region 21 having a conductivity type opposite to that of lightly doped n-type drift region 8 of IGBT element EL. This structure can prevent deterioration of breakdown properties between the collector and emitter of IGBT element EL.

More preferably, p-type region 21 is doped with impurities for achieving the conductivity type opposite to that of lightly doped n-type drift region 8, and the concentration of these impurities is higher than that of impurities with which p-type channel region 17 of IGBT element EL is doped for achieving the conductivity type opposite to that of lightly doped n-type drift region 8. Thereby, p-type channel region 17 can be inverted into the n type without inverting p-type region 21 to the n type. In contrast to the second comparison example in which field oxide film 7 of a relatively large thickness from about 1 μm to 2 μm is present between the gate resistance and p-type region 21, only thin insulating film 14b of about tens of micrometers to two hundred micrometers is present between the gate resistance and p-type region 21 in this embodiment, and this structure relatively easily causes the inversion of the conductivity type of p-type region 21. Therefore, the foregoing setting of the impurity concentrations can achieve a larger effect.

The potential of p-type region 21 is controlled to prevent formation of the inversion layer in p-type region 21. For this control, p-type region 21 is electrically connected, e.g., to n-type emitter region 15 of IGBT element EL. This structure can prevent deterioration of breakdown properties between the collector and emitter of IGBT element EL.

Second Embodiment

First, a structure of a IGBT chip that is a semiconductor device of a second embodiment will be described.

Referring to FIGS. 21-24, the IGBT chip of this embodiment has a metal portion 22. Metal portion 22 includes metal portions 22b1 and 22b2 arranged inside first trench T1, and a metal portion 22a arranged inside second trench T2. A material of metal portion 22 has a lower resistivity than a semiconductor material such as heavily doped n-type polycrystalline silicon. The material of metal portion 22 is, e.g., high-melting point metal such as tungsten, titanium, platinum or copper.

Figure 24:
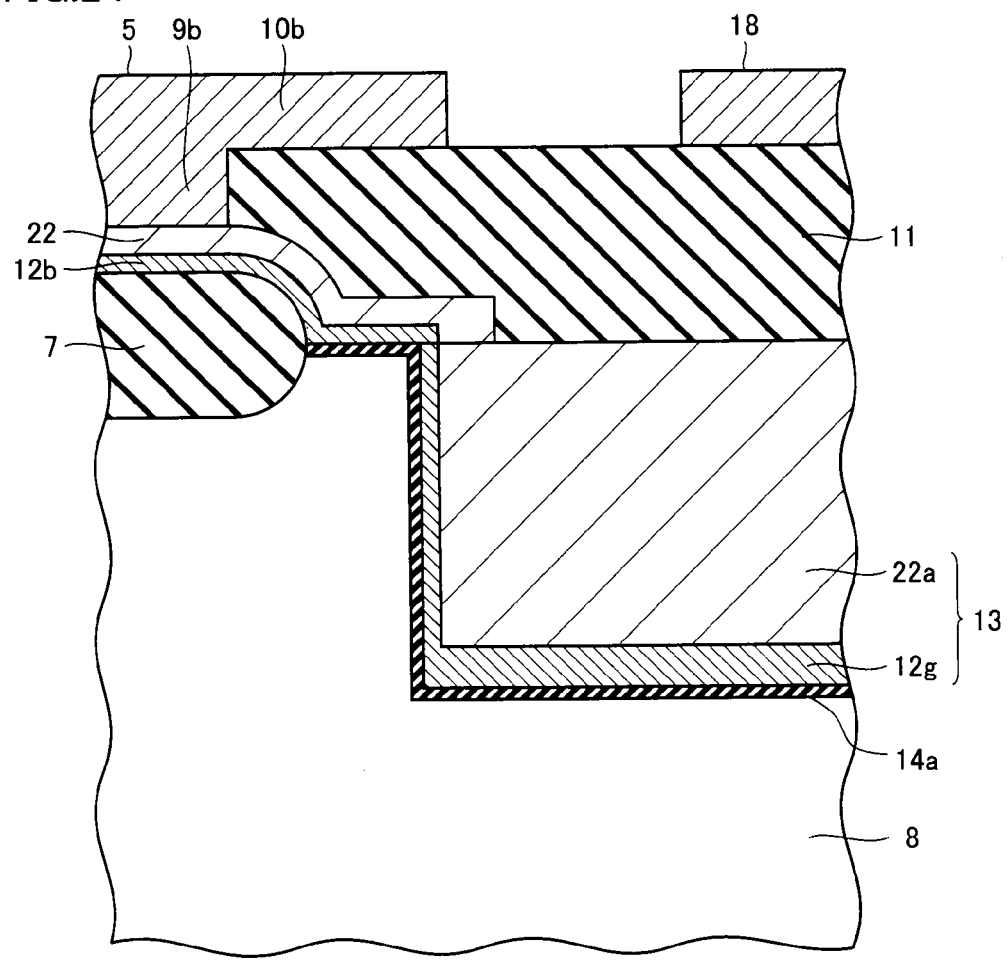

Referring to FIG. 24, gate electrode 13 has a polycrystalline silicon layer 12g, and metal portion 22a filling a space inside polycrystalline silicon layer 12g.

Figure 22:
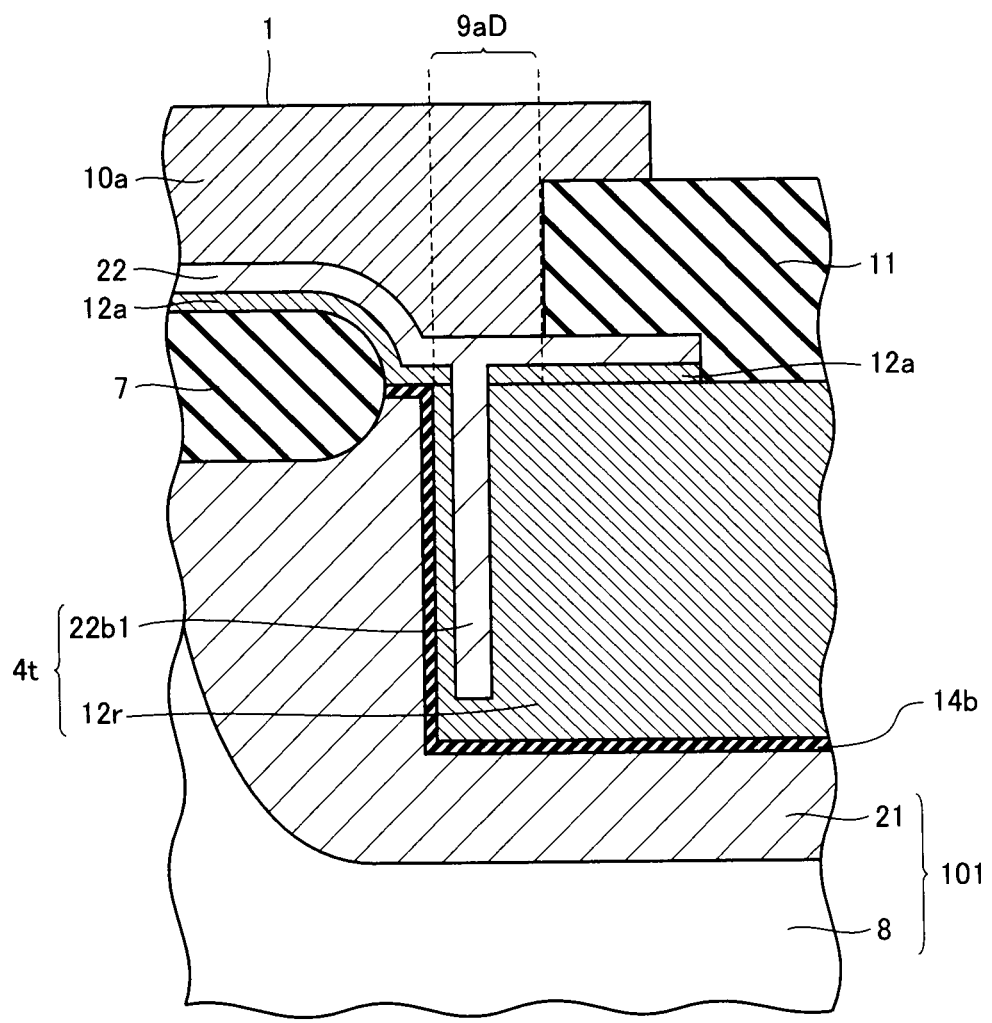
FIGS. 22-24 are schematic cross sections taken along lines XXII-XXII, XXIII-XXIII and XXIV-XXIV in FIG. 21, respectively.
Figure 23:
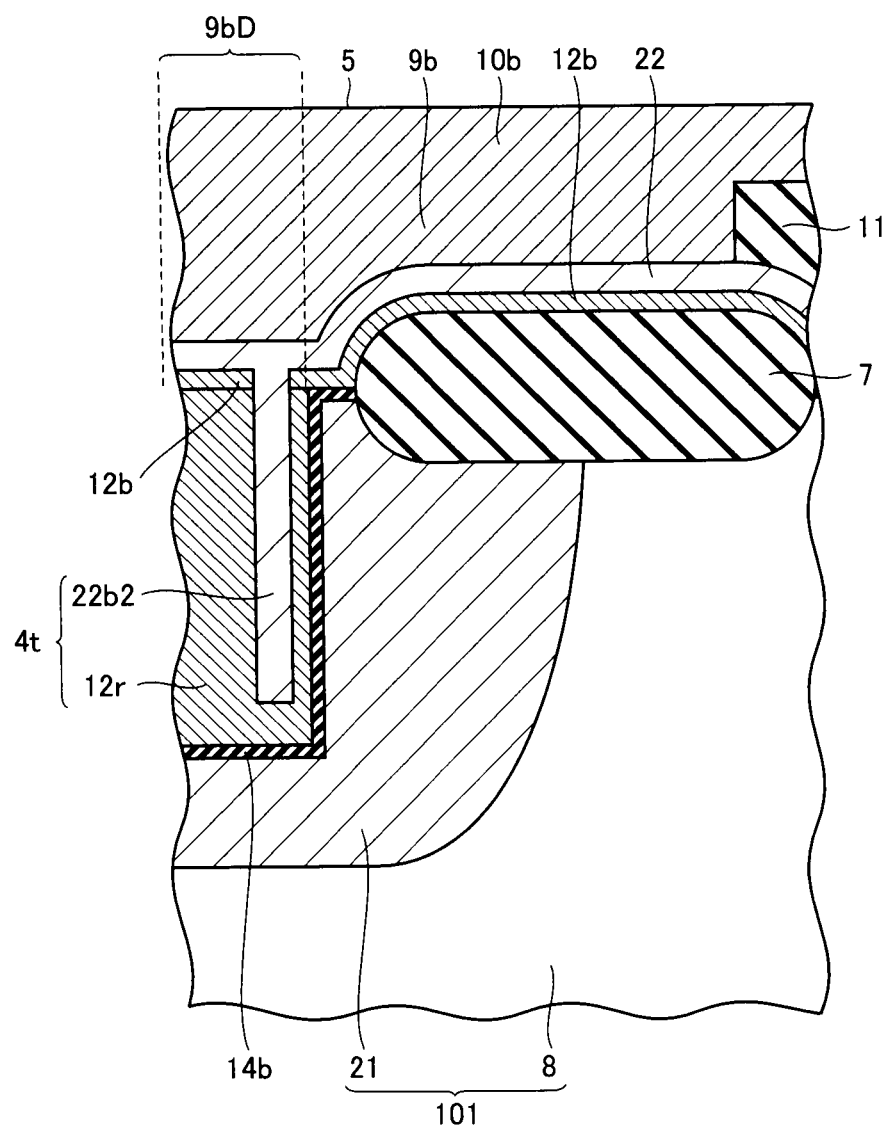

Referring to FIGS. 22 and 23, trench type internal gate resistance 4t has buried metal portion 22b1 in a portion opposed to gate pad side contact hole 9aD. Also, trench type internal gate resistance 4t has buried metal portion 22b2 in a portion opposed to a main interconnection side contact hole 9bD.

The portion of trench type internal gate resistance 4t other than buried metal portions 22b1 and 22b2 is formed of a polycrystalline silicon layer 12r. Buried metal portions 22b1 and 22b2 are electrically connected together via polycrystalline silicon layer 12r.

Figure 21:
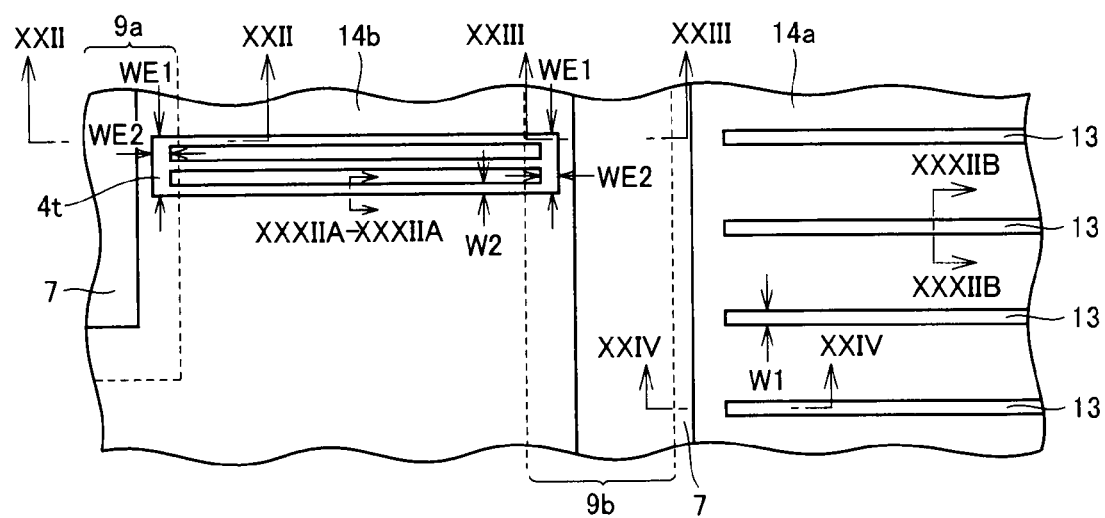
FIG. 21 is a schematic fragmentary plan view of a structure of a semiconductor device according to a second embodiment of the invention. The area shown in FIG. 21 corresponds to that shown in FIG. 6. A gate pad, a gate main interconnection, an emitter pad, an interlayer insulating film, and polycrystalline silicon layers on a gate pod side and a main interconnection side are not shown similarly to FIG. 6.

Referring primarily to FIG. 21, interlayer insulating film 11 (FIGS. 23 and 24) arranged on trench type internal gate resistance 4t is located between gate pad side contact hole 9a and main interconnection side contact hole 9b that are represented by broken lines. The portion of trench type internal gate resistance 4t opposed to interlayer insulating film 11 has a minimum width of W2. FIG. 21 shows by way of example a structure in which the portion of trench type internal gate resistance 4t opposed to interlayer insulating film 11 has constant width W2.

Trench type internal gate resistance 4t has a portion that is opposed to gate pad side contact hole 9a, and this portion has width WE1 larger than width W2. This portion of large width WE1 has a length WE2 larger than width W2.

Referring to FIG. 22, the portion having width W2 is located under interlayer insulating film 11, and is formed of polycrystalline silicon layer 12r. The portion having width WE1 includes metal portion 22b1 having a lower resistivity than polycrystalline silicon layer 12r.

Trench type internal gate resistance 4t includes a portion that is opposed to main interconnection side contact hole 9b, and this portion has width WE1 larger than width W2. This portion having large width WE1 has length WE2 larger than width W2.

Referring to FIG. 23, the portion having width WE1 includes metal portion 22b2 having a lower resistivity than polycrystalline silicon layer 12r, Referring to FIG. 21, gate electrode 13 has the maximum width (i.e., the longitudinal size in FIG. 21) equal to width W1. This width W1 is larger than width W2. FIG. 21 shows by way of example a structure in which gate electrode 13 has constant width W1.

Referring to FIG. 24, the portion of gate electrode 13 having width W1 includes metal portion 22a having a lower resistivity than polycrystalline silicon layer 12g.

Structures other than the above are substantially the same as those in the first embodiment. Therefore, the same or corresponding elements bear the same reference numbers, and description thereof is not repeated.

A modification of the structure of trench type internal gate resistance 4t according to this embodiment will now be described.

Figure 25:
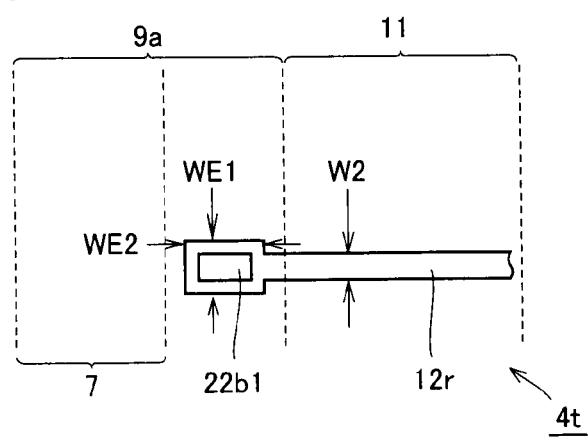
FIGS. 25 and 26 are fragmentary plan views schematically showing structures of resistances each having a buried metal portion in first and second modifications of the semiconductor device of the second embodiment of the invention, respectively.
Figure 26:
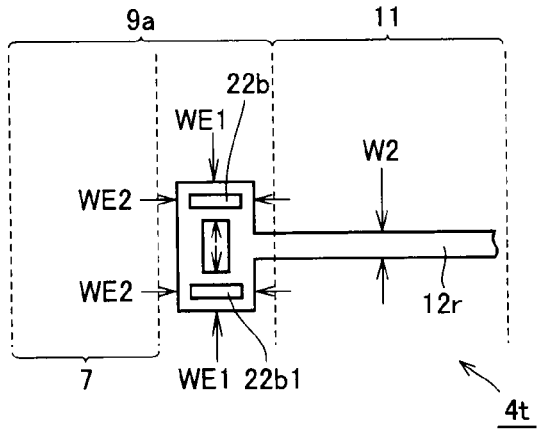

FIGS. 25 and 26 are fragmentary plans schematically showing first and second modifications of the semiconductor device of the second embodiment of the invention, and particularly showing structures of the resistance elements having metal portions buried therein, respectively. Broken lines in FIGS. 25 and 26 approximately illustrate positional relationships of the resistance element with respect to the field oxide film, gate pad side contact hole and interlayer insulating film.

Referring to FIG. 25, trench type internal gate resistance 4t in the first modification has a portion that is opposed to gate pad side contact hole 9a, and this portion has width WE1 larger than width W2. The portion of width WE1 has a portion of length WE2 larger than width W2. The portion of width WE1 of trench type internal gate resistance 4t has buried metal portion 22b1.

Referring to FIG. 26, trench type internal gate resistance 4t in the second modification has a plurality of portions that are opposed to gate pad side contact hole 9a and each have width WE1 larger than width W2. Each portion of width WE1 has a portion of length WE2 larger than width W2. Each portion of width WE1 of trench type internal gate resistance 4t has buried metal portion 22b1.

The first and second modifications have been described in connection with the structures in which a part of metal portion 22 is buried in the portion opposed to gate pad side contact hole 9a. The portion opposed to main interconnection side contact hole 9b may have substantially the same structure as that above.

A method of manufacturing the semiconductor device of this embodiment will now be described.

Figure 27A:
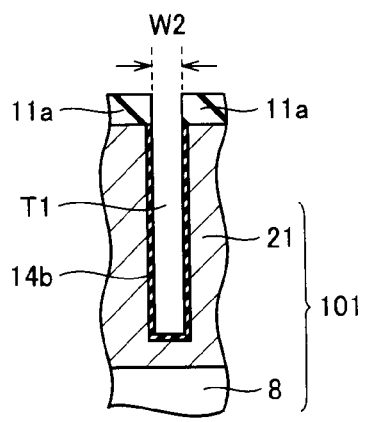
FIGS. 27A, 28A, 29A, 30A, 31A and 32A are schematic cross sections showing first to sixth steps in a method of manufacturing the semiconductor device according to the second embodiment of the invention, respectively, and taken along line XXXIIA-XXXIIA in FIG. 21.
Figure 27B:
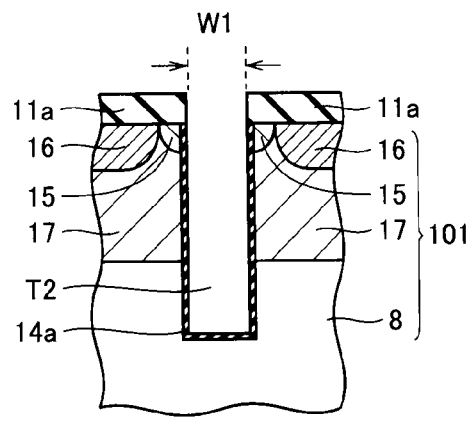
FIGS. 27B, 28B, 29B, 30B, 31B and 32B are schematic cross sections showing the first to sixth steps in the method of manufacturing the semiconductor device according to the second embodiment of the invention, respectively, and taken along line XXXIIB-XXXIIB in FIG. 21.

Referring to FIGS. 27A and 27B, an interlayer insulating film 11a made of a silicon oxide film or the like is deposited on semiconductor substrate 101. Interlayer insulating film 11a will form a part of interlayer insulating film 11.

Interlayer insulating film 11a is patterned by the photoengraving method. Patterned interlayer insulating film 11a is used as a mask, and etching is effected on semiconductor substrate 101 to form first and second trenches T1 and T2. Interlayer insulating films 14b and 14a are formed by oxidation, deposition and the like on the inner surfaces of first and second trenches T1 and T2, respectively.

Thereby, first trench T1 of width W2 covered with insulating film 14b is formed. Also, second trench T2 of width W1 covered with gate insulating film 14a is formed.

Figure 28A:
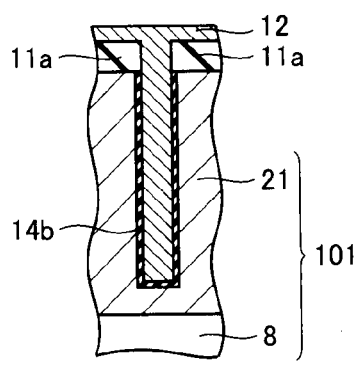
Figure 28B:
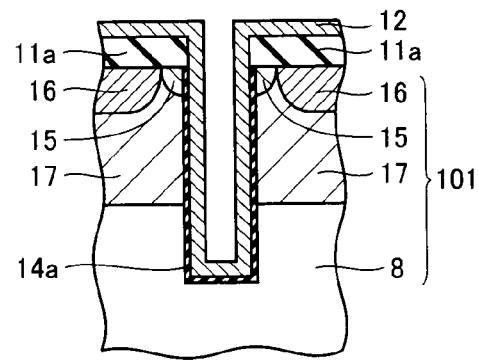

Referring primarily to FIGS. 28A and 28B, a polycrystalline silicon layer 12 heavily doped with impurities is deposited on semiconductor substrate 101. Deposited polycrystalline silicon layer 12 completely fills a portion of width W2 (FIG. 27A) of first trench T1. The portion of width WE1 of first trench T1 (i.e., the portion opposed to gate pad side contact hole 9aD in FIG. 22) is filled only partially. As shown in FIG. 28B, second trench T2 is filled only partially.

Figure 29A:
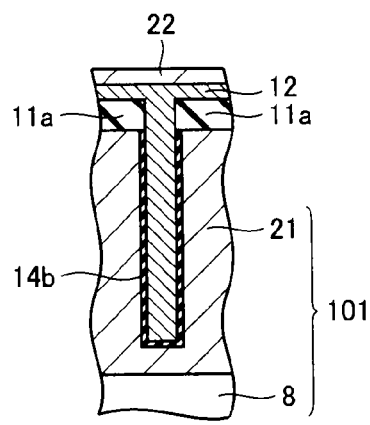
Figure 29B:
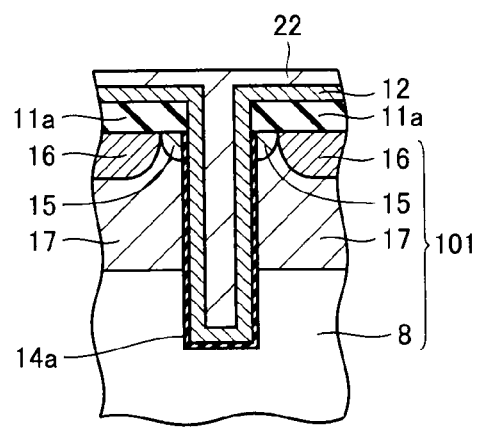

Referring to FIGS. 29A and 29B, metal portion 22 made of high melting point metal or the like is deposited on polycrystalline silicon layer 12 on semiconductor substrate 101. This completely fills a partial space that is left in the portion of width WE1 of first trench T1 (i.e., in the portion opposed to gate pad side contact hole 9aD in FIG. 22). Also, second trench T2 is completely filled as shown in FIG. 29B.

Then, metal portion 22 and polycrystalline silicon layer 12 are successively etched back.

Figure 30A:
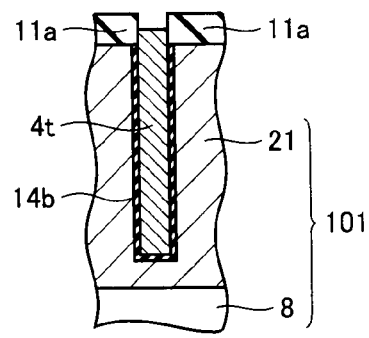
Figure 30B:
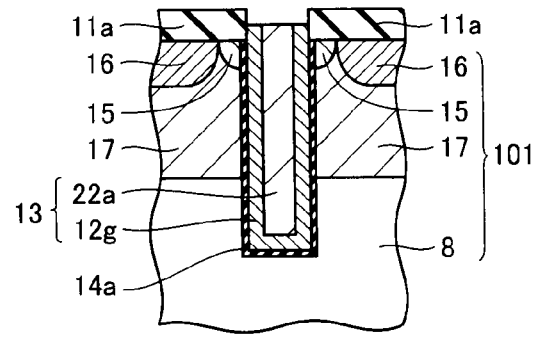

Referring to FIGS. 30A and 30B, the above etchback exposes interlayer insulating film 11a.

Figure 31A:
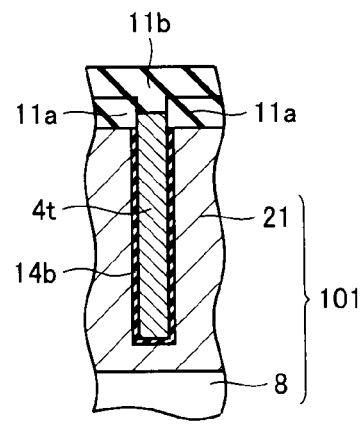
Figure 31B:
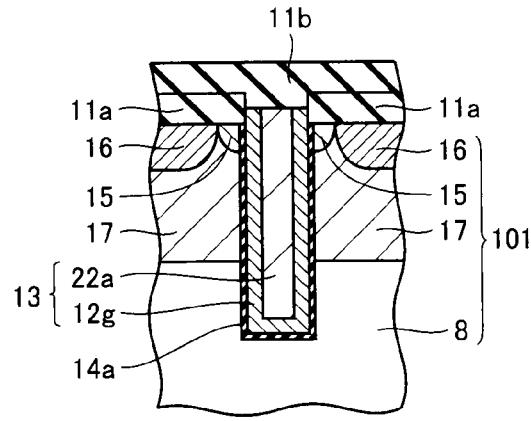

Referring to FIGS. 31A and 31B, an interlayer insulating film 11b is formed on semiconductor substrate 101. For example, in a method for this formation, a BPSG (Boron-Phospho Silicate Glass) film is deposited, and is subjected to heat treatment to flatten the surface of the insulating film. Interlayer insulating film 11b will form a part of interlayer insulating film 11.

Figure 32A:
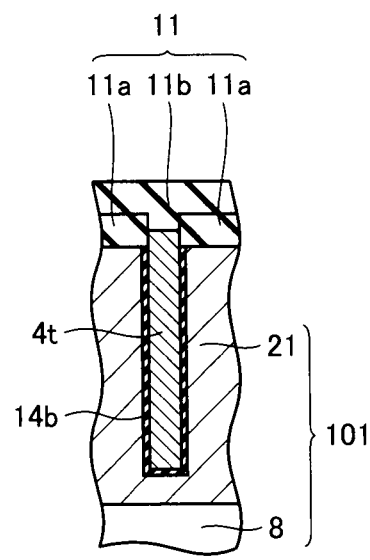
Figure 32B:
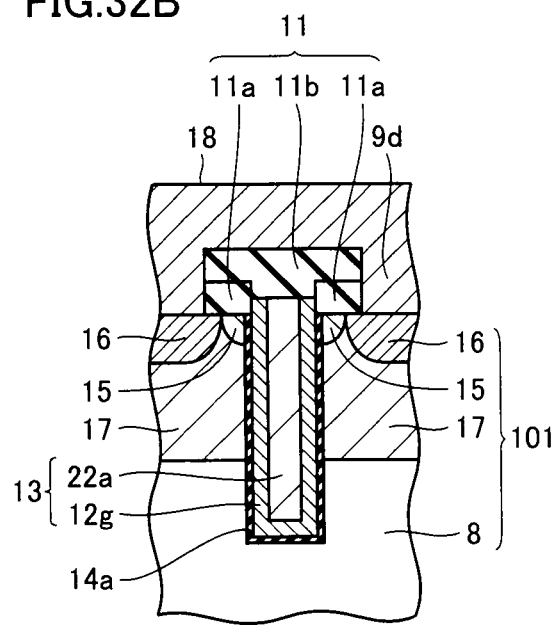

Referring to FIGS. 32A and 32B, interlayer insulating films 11a and 11b are selectively removed to form emitter contact hole 9d, gate pad side contact hole 9a (FIG. 21) and main interconnection side contact hole 9b (FIG. 21).

Then, a metal film made of an electrode material such an aluminum or a compound thereof is deposited, and is patterned to form emitter pad 18, gate pad metal layer 10a (FIG. 22) and main interconnection metal layer 10b (FIGS. 23 and 24).

By the above processing, the IGBT chip that is the semiconductor device of the embodiment is formed.

The step of forming n-type emitter region 15, heavily doped p-type region 16, p-type channel region 17 and the like at semiconductor substrate 101 can be executed either before or after the step of forming first and second trenches T1 and T2.

Then, a method of manufacturing the semiconductor device of the third comparison example will be described. The structure of this comparison example differs from that of the second comparison example in that metal portion 22 is added.

Figure 33A:
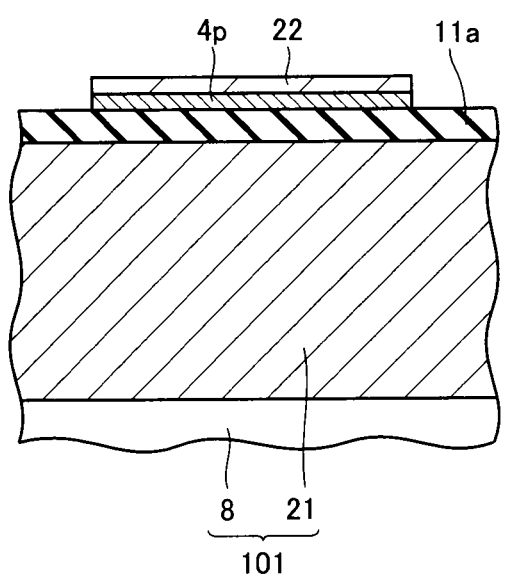
FIGS. 33A, 34A, 35A, 36A, 37A and 38A are fragmentary cross sections schematically showing first to sixth steps in a method of manufacturing a semiconductor device of a third comparison example, respectively, and particularly showing a structure near a plane-type internal gate resistance in a section corresponding to that taken along line XX-XX in FIG. 19.
Figure 33B:
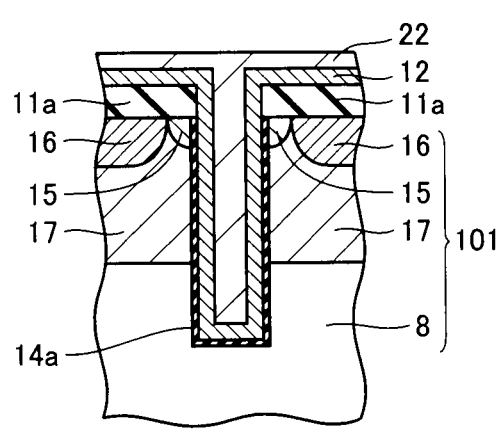
FIGS. 33B, 34B, 35B, 36B, 37B and 38B are fragmentary cross sections schematically showing the first to sixth steps in the method of manufacturing the semiconductor device of the third comparison example, respectively, and particularly showing a structure in a section corresponding to that taken along line XXXIIB-XXXIIB in FIG. 21.

Referring to FIGS. 33A and 33B, steps are performed similarly to the steps for forming the structures in FIGS. 29A and 29B, but first trench T1 is not formed in contrast to this embodiment. Consequently, as shown in FIG. 33A, plane type internal gate resistance 4p is formed along a flat substrate surface of semiconductor substrate 101 instead of trench type internal gate resistance 4t of this embodiment.

Figure 34A:
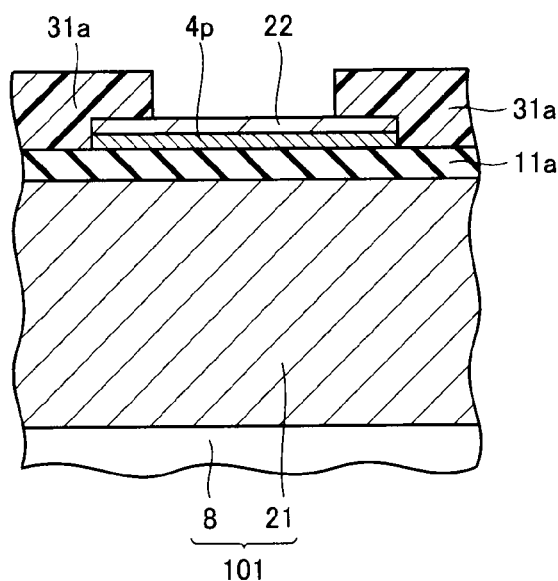
Figure 34B:
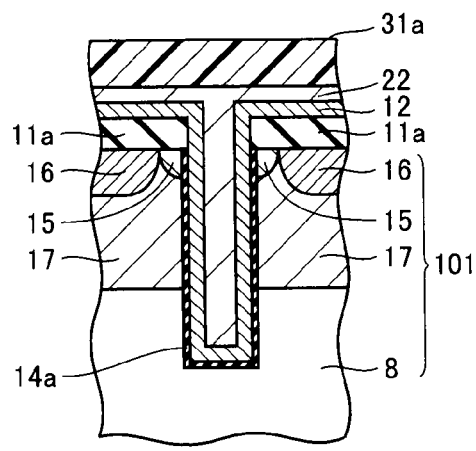

Referring to FIGS. 34A and 34B, photoresist 31a is applied onto semiconductor substrate 101. As shown in FIG. 34A, photoresist 31a is patterned by the photoengraving method. Thereby, metal portion 22 is partially exposed on plane type internal gate resistance 4p.

Figure 35A:
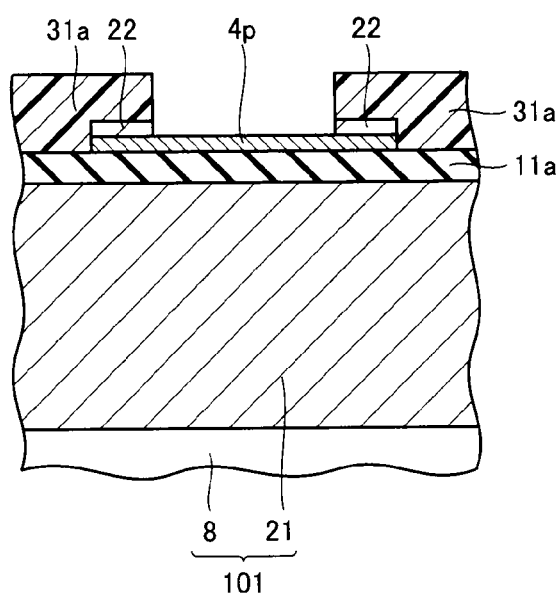
Figure 35B:
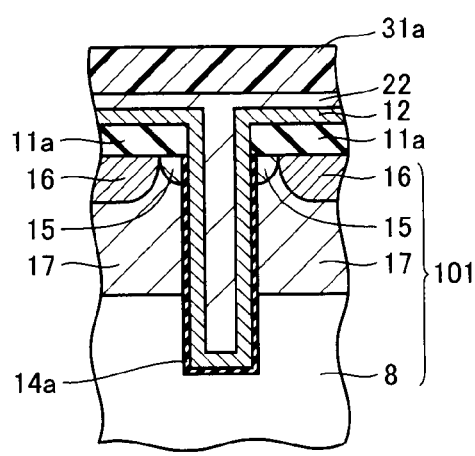

Referring to FIGS. 35A and 35B, etching is effected on a portion of metal portion 22 not covered with photoresist 31a. This divides metal portion 22 into a plurality of regions as shown in FIG. 35A. Thereafter, photoresist 31a is removed.

Figure 36A:
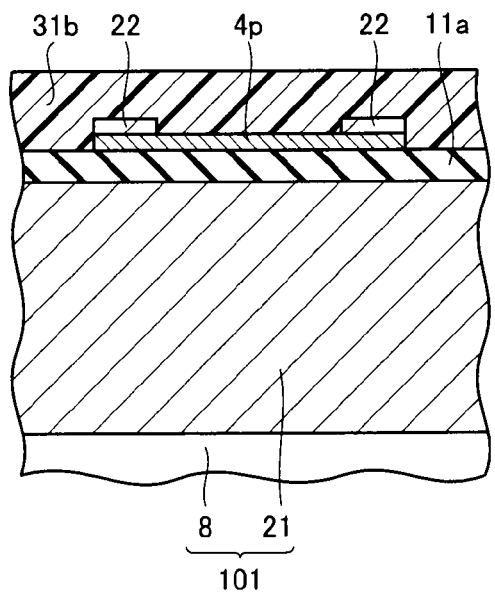
Figure 36B:
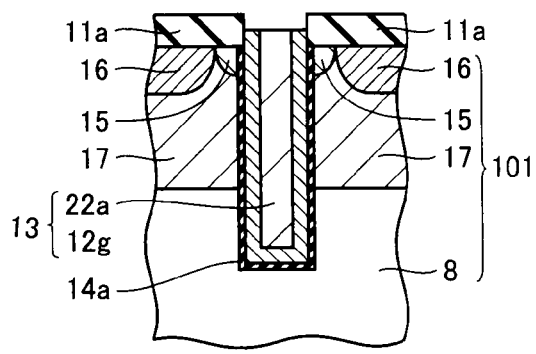

Referring primarily to FIGS. 36A and 36B, photoresist 31b is applied onto semiconductor substrate 101. Photoresist 31b is patterned by the photoengraving method such that photoresist 31b covers a region in which plane type internal gate resistance 4p is formed, and exposes a portion near gate electrode 13. Etchback is successively effected on metal portion 22 and polycrystalline silicon layer 12 (FIG. 35B) to expose interlayer insulating film 11a in the region not masked with photoresist 31b. Thereafter, photoresist 31b is removed.

Figure 37A:
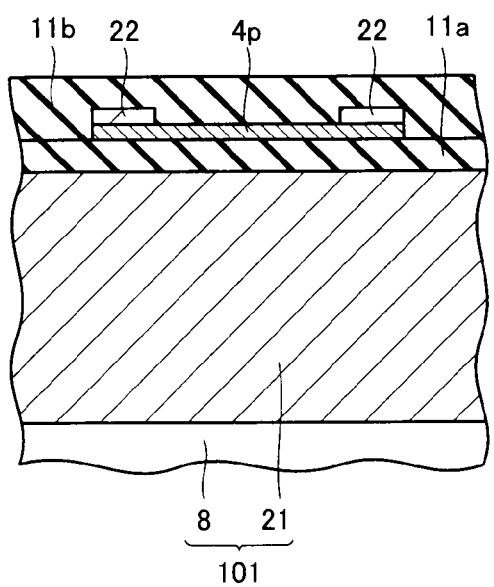
Figure 37B:
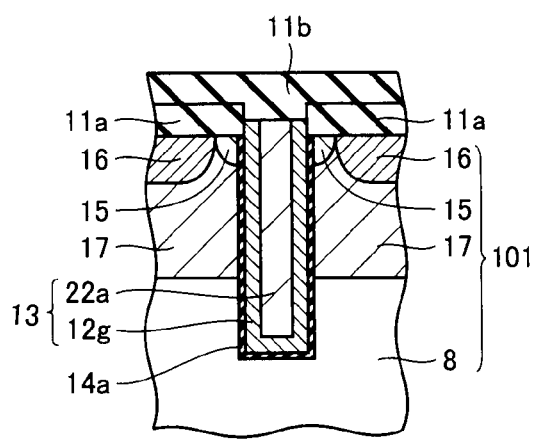

Referring to FIGS. 37A and 37B, interlayer insulating film 11b is formed on semiconductor substrate 101. For example, in a method for this formation, a BPSG (Boron-Phospho Silicate Glass) film is deposited, and is subjected to heat treatment to flatten the surface of the insulating film.

Figure 38A:
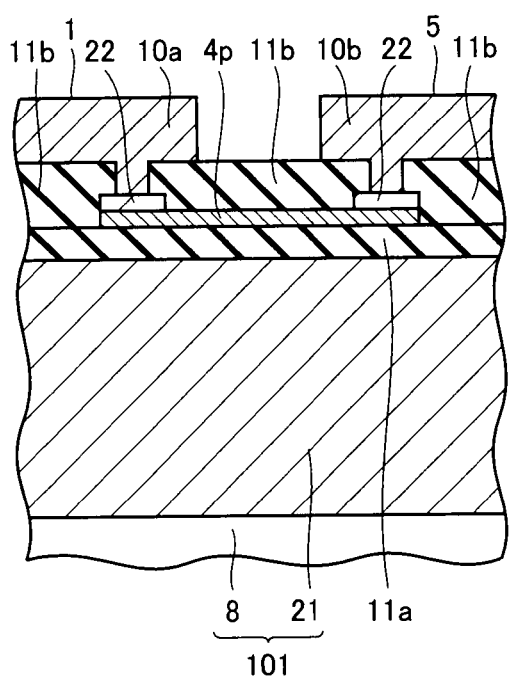
Figure 38B:
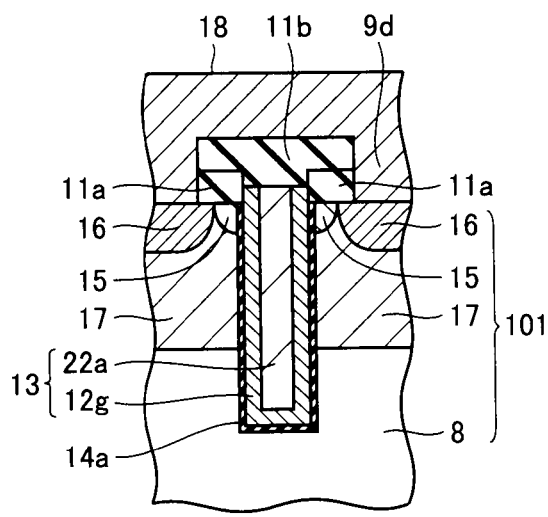

Referring to FIGS. 38A and 38B, interlayer insulating films 11a and 11b are selectively etched. Thereby, contact holes such as emitter contact hole 9d is formed. Then, emitter pad 18, gate pad metal layer 10a and main interconnection metal layer 10b are formed.

By the above steps, the semiconductor device of this comparison example is formed. The method of manufacturing the semiconductor device of this comparison example requires the steps shown in FIGS. 34A and 34B as well as FIGS. 35A and 35B for etching metal portion 22 masked with photoresist 31a, and thus requires the complicated steps.

Further, in the etching process for removing metal portion 22, the film thickness of plane type internal gate resistance 4p varies due to variations in over etching. This results in variations in resistance value of plane type internal gate resistance 4p serving as the gate resistance.

In this embodiment, the portion of trench type internal gate resistance 4t having width WE1 (FIG. 21) includes metal portion 22b1 in the position opposed to gate pad side contact hole 9aD in addition to polycrystalline silicon layer 12r as shown in FIG. 22. This metal portion 22b1 has a lower resistivity than polycrystalline silicon layer 12r. This structure relieves local concentration of the current between gate pad 1 and trench type internal gate resistance 4t, and increases the reliability of the IGBT chip.

The portion of trench type internal gate resistance 4t having width WE1 (FIG. 21) includes metal portion 22b2 in the position opposed to main interconnection side contact hole 9bD in addition to polycrystalline silicon layer 12r as shown in FIG. 23. This metal portion 22b2 has a lower resistivity than polycrystalline silicon layer 12r. This structure relieves local concentration of the current between gate main interconnection 5 and trench type internal gate resistance 4t, and increases the reliability of the IGBT chip.

As shown in FIG. 21, gate electrode 13 has width W1 larger than width W2 of trench type internal gate resistance 4t. Thus, as shown in FIGS. 27A and 27B, width W1 of the trench for forming gate electrode 13 is larger than width W2 of the trench for forming trench type internal gate resistance 4t. Therefore, such states can be simultaneously achieved that the trench of width W2 is entirely filled with polycrystalline silicon layer 12 and that the portion of width W1 is not completely filled. As shown in FIG. 30, therefore, metal portion 22a can be arranged in the portion that is not filled with the polycrystalline silicon layer.

As described above, the trench of width W2 is entirely filled with polycrystalline silicon layer 12 of a relatively high resistivity so that trench type internal gate resistance 4t having a sufficiently high resistance value can be achieved.

Further, gate electrode 13 includes metal portion 22a having a lower resistivity than polycrystalline silicon layer 12 so that the electric resistance of gate electrode 13 can be suppressed. Thereby, the variations in transmission delay of gate potentials in gate electrodes can be suppressed. This suppress a time for which an on region and an off region coexist in the switching operation of IGBT element EL. Therefore, it is possible to shorten the time for which the current flowing between the collector and emitter of IGBT element EL concentrates at a part of on regions. Accordingly, local heating in a part of on regions can be suppressed so that the IGBT chip can have improved reliability.

Third Embodiment

First, a structure of an IGBT chip that is a semiconductor device of a third embodiment will be described.

Figure 39:
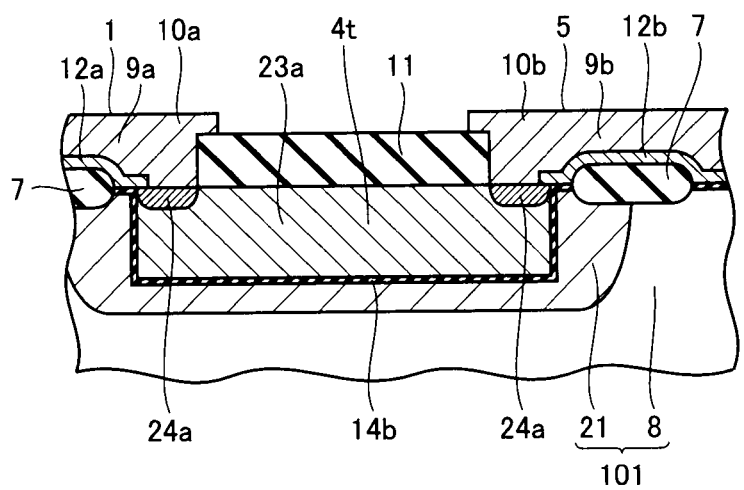
FIG. 39 is a fragmentary cross section schematically showing a structure near a resistance element of a semiconductor device according to a third embodiment of the invention.

Referring to FIG. 39, trench type internal gate resistance 4t that is a resistance element of the semiconductor device of this embodiment includes, as a major element, an n-type lightly doped polycrystalline silicon layer 23a. Trench type internal gate resistance 4t has an n-type heavily doped polycrystalline silicon layer 24a located in portions that are in contact with gate pad side contact hole 9a and main interconnection side contact hole 9b.

The semiconductor device of this embodiment differs from those of the first and second embodiments in that a major portion of the buried substance of trench type internal gate resistance 4t is the polycrystalline silicon layers of a lower concentration than those in the first and second embodiments, and the potential difference between trench type internal gate resistance 4t and p-type region 21 in contact with it can be adjusted so that n-type lightly doped polycrystalline silicon layer 23a can attain at least two states among an accumulation state, a depletion state and an inversion state.

Structures other than the above are substantially the same as those in the first embodiment already described. Therefore, the same or corresponding elements bear the same reference numbers, and description thereof is not repeated.

Figure 43:
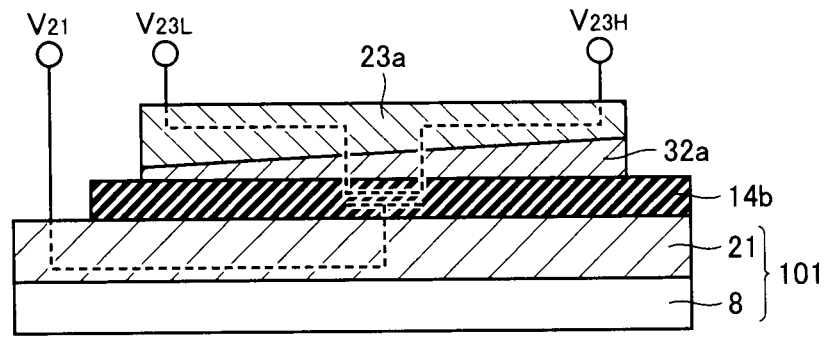
FIGS. 43-45 illustrate operations of the resistance element in the semiconductor device according to the third embodiment of the invention.
Figure 45:
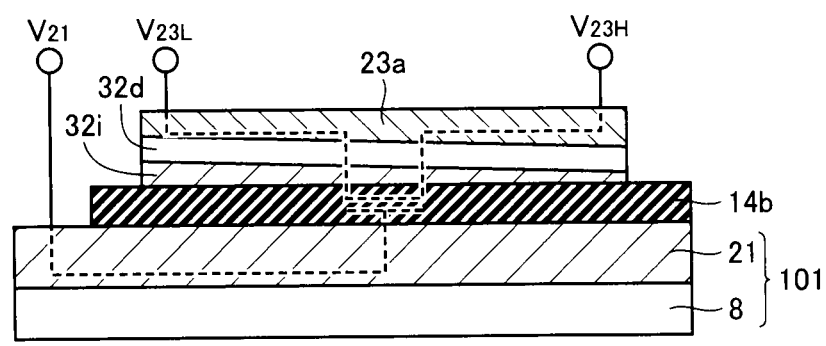

An operation of the resistance element in the semiconductor device of this embodiment will now be described. Referring to FIGS. 43 and 45, $V_{23H}$ and $V_{23L}$ indicate potentials on the opposite ends of the current path of n-type lightly doped polycrystalline silicon layer 23a, respectively. $V_{21}$ indicates the potential of insulating film 14b side of semiconductor substrate 101, and indicates the potential of p-type region 21 when p-type region 21 is employed in semiconductor substrate 101.

Referring to FIG. 43, when $V_{21}$ satisfies ($V_{21} > V_{23L} \gg V_{23H}$), n-type lightly doped polycrystalline silicon layer 23a is in the accumulation state. Thus, an accumulation layer 32a of electrons is formed at the surface on insulating film 14b side of n-type lightly doped polycrystalline silicon layer 23a. In this case, electrons, i.e., carriers are distributed throughout n-type lightly doped polycrystalline silicon layer 23a so that whole n-type lightly doped polycrystalline silicon layer 23a can form the current path in trench type internal gate resistance 4t.

Figure 44:
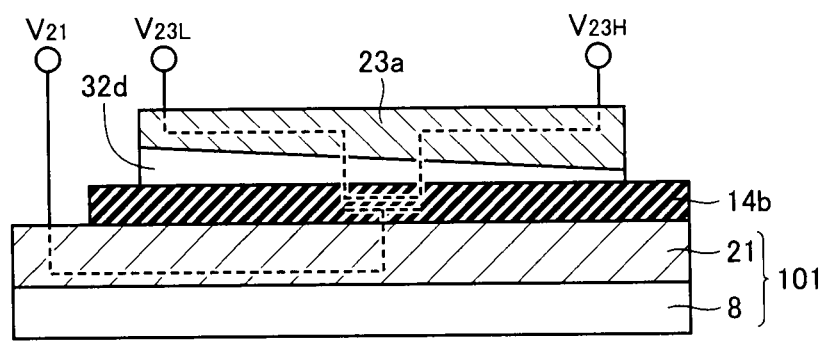

Referring to FIG. 44, when $V_{21}$ satisfies ($0 > (V_{21} - V_{23L}) > (V_{th}$ with $V_{23L})$), n-type lightly doped polycrystalline silicon layer 23a attains the depletion state. Thus, a depletion layer 32d is formed at the surface on insulating film 14b side of n-type lightly doped polycrystalline silicon layer 23a. In this case, depletion layer 32d does not form the current path in trench type internal gate resistance 4t so that the resistance value of trench type internal gate resistance 4t increases. In the above formula, $V_{th}$ indicates a potential that achieves a threshold determining whether n-type lightly doped polycrystalline silicon layer 23a can pass the current or not.

Referring to FIG. 45, when $V_{21}$ satisfies ($0 > (V_{th}$ with $V_{23H}) > (V_{21} - V_{23H})$), n-type lightly doped polycrystalline silicon layer 23a attains the inversion state. More specifically, depletion layer 32d and an inversion layer 32i are formed at the surface on insulating film 14b side of n-type lightly doped polycrystalline silicon layer 23a. In this case, depletion layer 32d does not form a current path in trench type internal gate resistance 4t. Also, depletion layer 32d isolates inversion layer 32i from the current path of trench type internal gate resistance 4t. Therefore, the resistance value of trench type internal gate resistance 4t further increases.

Figure 40:
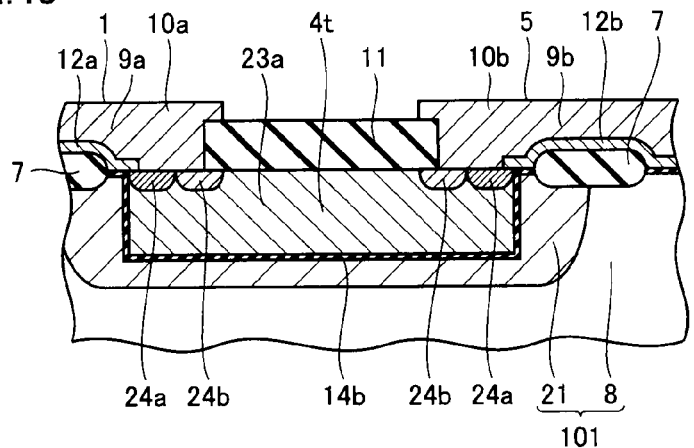
FIGS. 40-42 are fragmentary cross sections schematically showing structures near the resistance elements in the semiconductor devices of first to third modifications of the third embodiment of the invention, respectively.

Referring to FIG. 40, trench type internal gate resistance 4t that is a resistance element of a semiconductor device of a first modification of the embodiment differs from that of this embodiment in that the structure of the first modification further includes a p-type heavily doped polycrystalline silicon layer 24b arranged at portions in contact with gate pad side contact hole 9a and main interconnection side contact hole 9b.

Figure 41:
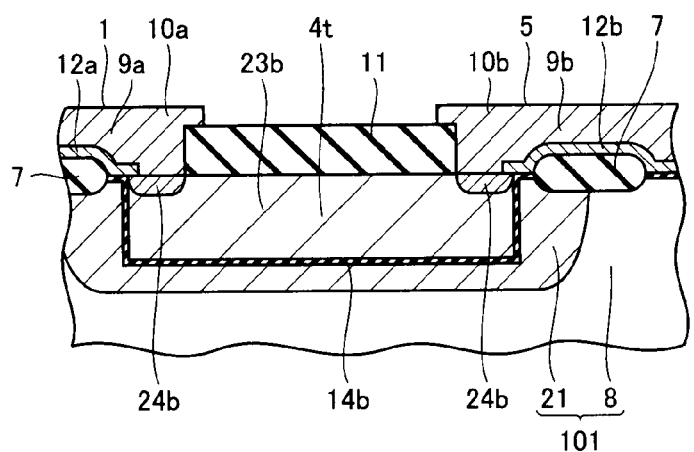

Referring to FIG. 41, trench type internal gate resistance 4t that is a resistance element of a semiconductor device of a second modification of the embodiment includes, as a major portion, p-type lightly doped polycrystalline silicon layer 23b that is a semiconductor region. Trench type internal gate resistance 4t includes p-type heavily doped polycrystalline silicon layer 24b arranged at portions in contact with gate pad side contact hole 9a and main interconnection side contact hole 9b.

Figure 42:
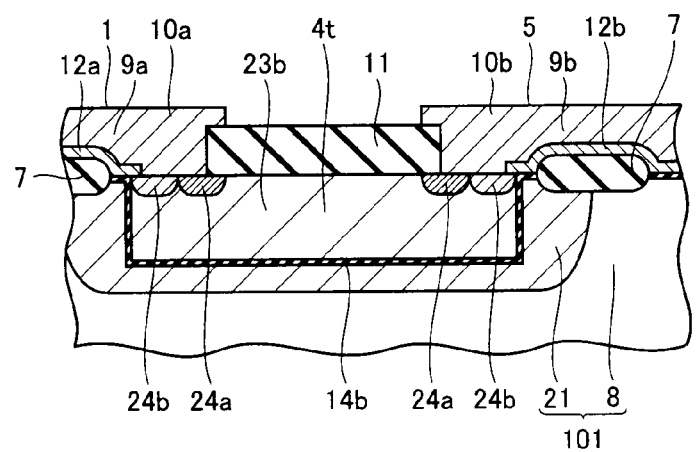

Referring to FIG. 42, trench type internal gate resistance 4t that is a resistance element of a semiconductor device of a third modification of the embodiment differs from that of the second modification of this embodiment in that the structure of the third modification further includes n-type heavily doped polycrystalline silicon layer 24a arranged at portions in contact with gate pad side contact hole 9a and main interconnection side contact hole 9b.

When the gate resistance in the depletion state is very high for the purpose of achieving a desired gate delay, the structure may be used together with trench type internal gate resistance 4t of the first embodiment and/or trench type internal gate resistance 4t (FIGS. 22 and 23) of the second embodiment.

When gate electrode 13 is formed in steps different from those for trench type internal gate resistance 4t, the doping of the polycrystalline silicon can be performed at different concentrations in different steps, respectively. Thereby, the doping concentrations of gate electrode 13 and gate main interconnection 5 can be increased to lower the resistances so that the delay and loss in the IGBT chip can be suppressed.

In this embodiment, the potential difference between p-type region 21 and trench type internal gate resistance 4t produces the depletion layer at n-type lightly doped polycrystalline silicon layer 23a of trench type internal gate resistance 4t so that the resistance value of trench type internal gate resistance 4t can be adjusted.

Since n-type heavily doped polycrystalline silicon layer 24a is formed at the portion in contact with trench type internal gate resistance 4t, the gate resistance increases with time in the operation of turning off IGBT element EL. Thereby, the surge of IGBT element EL can be small.

In each of the first and third modifications of this embodiment, trench type internal gate resistance 4t is provided at the electric contact portion with n-type heavily doped polycrystalline silicon layer 24a and p-type heavily doped polycrystalline silicon layer 24b. Thereby, the gate resistance in the accumulation state decreases, and particularly the delay time is stable when the potential of ($V_g$<0V) is applied.

Fourth Embodiment

First, description will be given on a structure of a resistance element of a semiconductor device of this embodiment.

Figure 46:
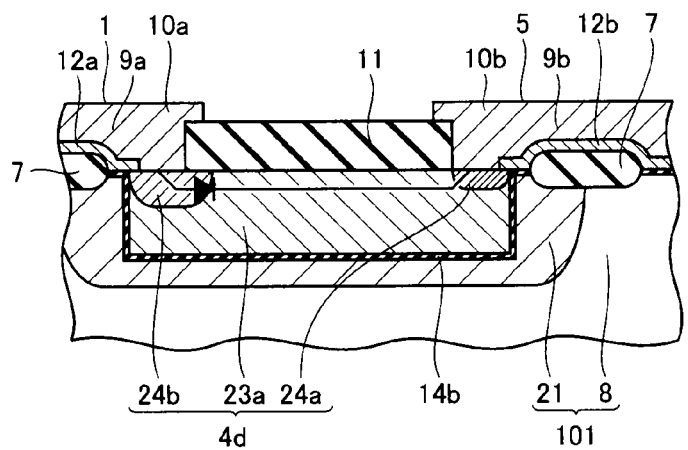
FIG. 46 is a fragmentary cross section schematically showing a structure near a resistance element of a semiconductor device according to a fourth embodiment of the invention.

Referring to FIG. 46, the IGBT chip of this embodiment has a diode type internal gate resistance 4d as a resistance element. Diode type internal gate resistance 4d has p-type heavily doped polycrystalline silicon layer 24b, n-type lightly doped polycrystalline silicon layer 23a and n-type heavily doped polycrystalline silicon layer 24a. n-type lightly doped polycrystalline silicon layer 23a is electrically connected to gate pad 1 and gate main interconnection 5 via p- and n-type heavily doped polycrystalline silicon layers 24b and 24a, respectively.

According to the above structure, diode type internal gate resistance 4d of this embodiment includes a diode (represented by a diode symbol in the figure) having a pn junction surface at a boundary surface between p-type heavily doped polycrystalline silicon layer 24b and n-type lightly doped polycrystalline silicon layer 23a.

In this embodiment, a selection range of the impurity concentration of n-type lightly doped polycrystalline silicon layer 23a is wider than that in the third embodiment. The impurity concentration of n-type lightly doped polycrystalline silicon layer 23a in the third embodiment is adjusted to attain at least two of the inversion state, accumulation state and depletion state, but this restriction is not imposed in this embodiment.

Structures other than the above are substantially the same as those in the third embodiment already described. Therefore, the same or corresponding elements bear the same reference numbers, and description thereof is not repeated.

An operation of the resistance element in the semiconductor device of this embodiment will now be described. In initial and final stages of the switching operation of IGBT element EL (not shown in FIG. 46), the potential difference between the opposite ends of diode type internal gate resistance 4d that is the gate resistance of gate electrode 13 (not shown in FIG. 46) is small. The diode exhibits a high resistance when a potential difference between an anode and a cathode is small. Conversely, the diode attains a low resistance when the potential difference between the opposite ends is large. Therefore, diode type internal gate resistance 4d has high resistance values during initial and final stages of the switching operation as compared with a middle stage.

Modifications of the semiconductor device of the embodiment will now be described.

Figure 47:
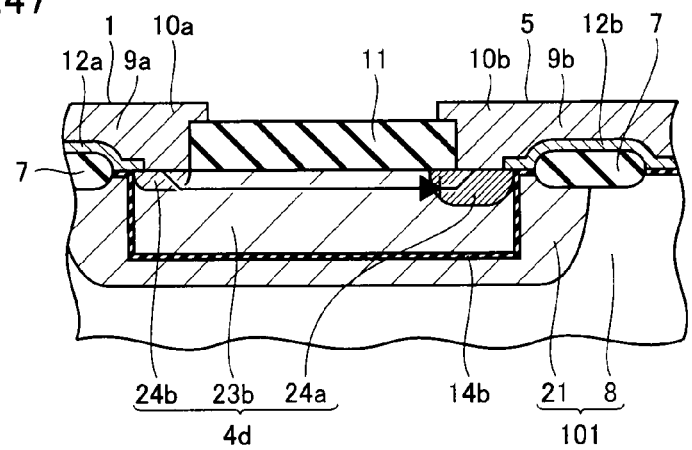
FIGS. 47 to 49 are fragmentary cross sections schematically showing structures of the resistance element in first to third modifications of the semiconductor device the fourth embodiment of the invention, respectively.

Referring to FIG. 47, diode type internal gate resistance 4d in a first modification of the embodiment includes a diode (represented by a diode symbol in the figure) having a pn junction surface at a boundary surface between p-type lightly doped polycrystalline silicon layer 23b and n-type heavily doped polycrystalline silicon layer 24a.

Figure 48:
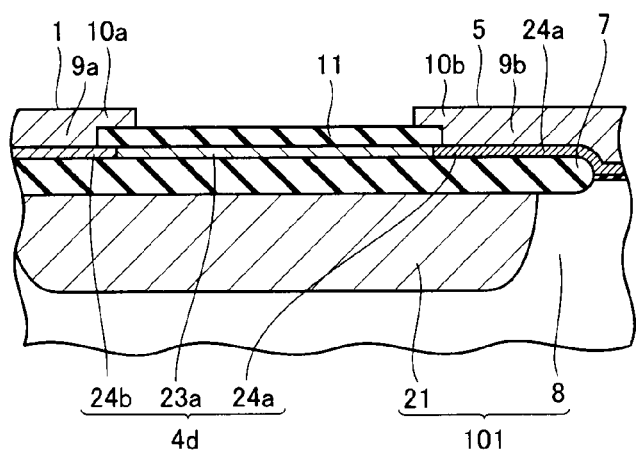

Referring to FIG. 48, a second modification of the embodiment differs from the embodiment in that diode type internal gate resistance 4d is not arranged inside the trench in semiconductor substrate 101, but is formed on field oxide film 7.

Figure 49:
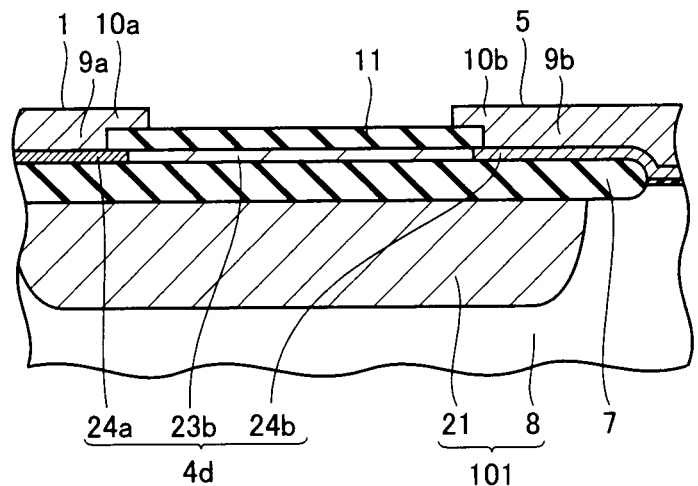

Referring to FIG. 49, in a third modification of the embodiment, the conductivity type of the diode is opposite to that in the second modification.

In this embodiment, diode type internal gate resistance 4d has high resistance values during the initial and final stages of the switching operation of IGBT element EL as compared with the middle stage. Therefore, generation of surge is suppressed. This provides the IGBT chip of a small loss.

When the noise signal that has a small pulse width and changes rapidly is applied to gate pad 1, the potential of gate electrode 13 can be less responsive to this noise signal so that a malfunction of IGBT element EL can be suppressed.

When the concentration of n-type lightly doped polycrystalline silicon layer 23a in FIG. 46 is similar to that in the third embodiment, effects similar to those of the third embodiment can be expected.

Diode type internal gate resistance 4d of this embodiment may be combined with the resistance element that is the ohmic gate resistance employed in the first embodiment, the resistance element that is employed in the third embodiment and has the resistance value changed by the potential difference with respect to p-type region 21, or a conventional resistance element. This combination can be achieved, e.g., by parallel connection.

In this case, since the gate resistance value is finely controlled according to the gate potential or potential difference between the opposite ends of the gate, it is possible to achieve a switching waveform of or close to a desired form.

Fifth Embodiment

A semiconductor element according to a semiconductor device of this embodiment has a diode, similarly to the fourth embodiment (FIG. 46). However, the diode included in the resistance element of this embodiment is a Zener diode that includes n-type lightly doped polycrystalline silicon layer 23a of a high impurity concentration and has a reverse breakdown voltage of a low value. Thus, the resistance element of this embodiment is a gate resistance of the Zener diode type. The Zener diode is configured to have a constant breakdown voltage, using reverse characteristics.

Structures other than the above are substantially the same as those in the fourth embodiment, and therefore description thereof is not repeated.

According to this embodiment, when a noise lower than the breakdown voltage is applied to the gate, gate electrode 13 is neither charged not discharged. Thereby, the malfunction of the IGBT chip can be suppressed.

Sixth Embodiment

Figure 50:
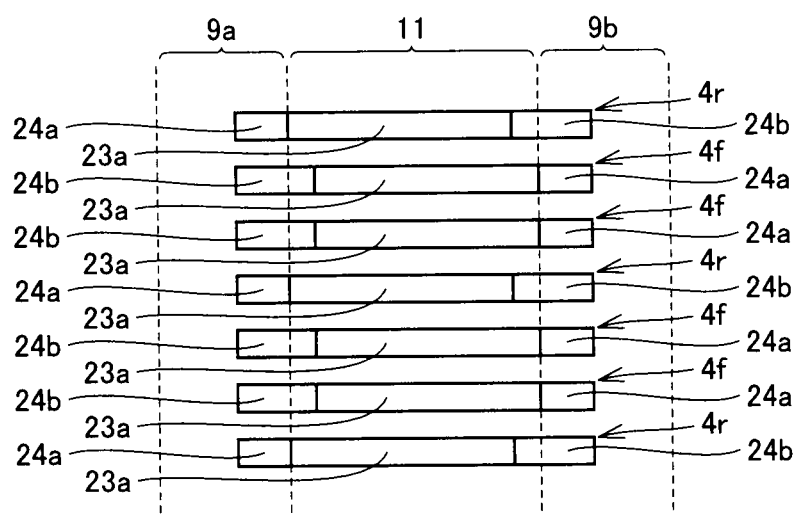
FIG. 50 is a plan view schematically showing a structure of a resistance element of a semiconductor device according to a sixth embodiment of the invention.
Figure 51:
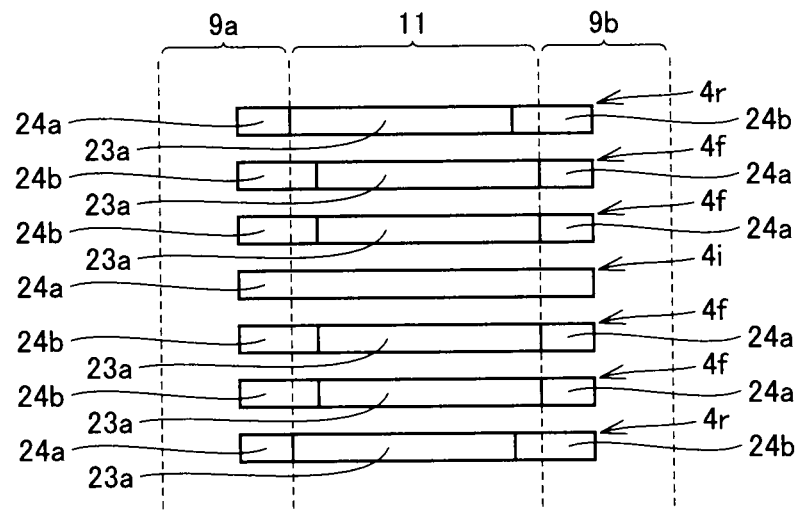
FIG. 51 is a plan view schematically showing a structure of a resistance element of a semiconductor device according to a modification of the sixth embodiment of the invention.

First, a structure of a resistance element of a semiconductor device of a sixth embodiment will be described. Referring to FIGS. 50 and 51, broken lines approximately illustrate positional relationships of the resistance element with respect to gate pad side contact hole 9a, main interconnection side contact hole 9b and interlayer insulating film 11.

Referring to FIG. 50, the semiconductor device of this embodiment has a plurality of diodes serving as resistance elements between gate pad side contact hole 9a and main interconnection side contact hole 9b. Thus, gate pad 1 (not shown in FIG. 50) and gate main interconnection 5 (not shown in FIG. 50) have a plurality of resistance elements connected electrically in parallel.

These plurality of diodes include at least one internal gate resistance 4f of a forward diode type and at least one internal gate resistance 4r of a reverse diode type. The "forward" and "reverse" relates to polarities of the diodes with respect to the direction from gate pad 1 to gate main interconnection 5.

Preferably, trench type internal gate resistances 4t are different in number from internal gate resistances 4r of the reverse diode type.

Structures other than the above are substantially the same as those in the fourth and fifth embodiments. Therefore, the same or corresponding elements bear the same reference numbers, and description thereof is not repeated.

According to this embodiment, effects similar to those of the fourth and fifth embodiments can be achieved in the on and off states of the switching of IGBT element EL.

By employing internal gate resistances 4f of the forward diode type that are different in number for internal gate resistances 4r of the reverse diode type, the plurality of resistance elements function, between gate pad 1 and gate main interconnection 5, as the resistance element having resistance values changing depending on the current direction. Therefore, it is possible to provide the resistance element having the electric resistance that changes depending on the on and off states of IGBT element EL.

As is done in the modification in FIG. 51, the resistance element of this embodiment may include the resistance element that is the ohmic gate resistance employed in the first embodiment, the resistance element that is employed in the third embodiment and has the resistance value changed by the potential difference with respect to p-type region 21, or an internal gate resistance 4i that that is a conventional resistance element.

Seventh Embodiment

First, a structure of a resistance element of a semiconductor device of a seventh embodiment will be described.

Figure 52:
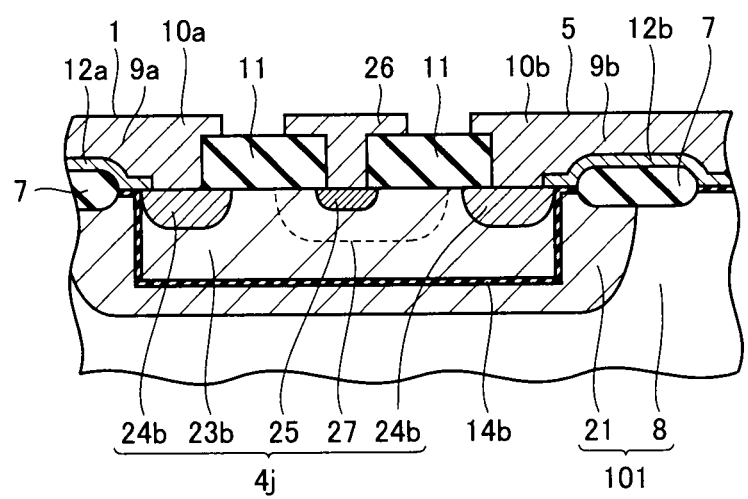
FIGS. 52 to 55 are fragmentary cross sections schematically showing structures near resistance elements of semiconductor devices according to seventh to tenth embodiments of the invention.

Referring to FIG. 52, an IGBT chip of this embodiment has a JFET (Junction Field Effect Transistor) type internal gate resistance 4j that is a resistance element including a junction field effect transistor. JFET type internal gate resistance 4j has a p-type lightly doped polycrystalline silicon layer 23b forming a channel region, a set of p-type heavily doped polycrystalline silicon layers 24b forming source/drain regions, and an n-type heavily doped polycrystalline silicon layer 25 forming a gate.

An electrode 26 is formed on n-type heavily doped polycrystalline silicon layer 25, and is electrically connected to thereto. Electrode 26 has a function of controlling a potential of n-type heavily doped polycrystalline silicon layer 25.

An operation of the resistance element of this embodiment will now be described. Electrode 26 controls the potential of n-type heavily doped polycrystalline silicon layer 25. Thereby, a depth (i.e., longitudinal size in the figure) of expansion of a depletion layer 27 is controlled so that the resistance value of JFET type internal gate resistance 4j is controlled.

Structures other than the above are substantially the same as those in the first embodiment. Therefore, the same or corresponding elements bear the same reference numbers, and description thereof is not repeated.

According to this embodiment, the resistance value of the resistance element can be changed by externally applying a potential signal to electrode 26.

Although JFET type internal gate resistance 4j including the p-channel type JFET has been described as the resistance element, a JFET type internal gate resistance including the n-channel type JFET may be used.

Although JFET type internal gate resistance 4j filling first trench T1 has been described as the resistance element, the resistance element may be of the plane type.

For achieving effects similar to those of the sixth embodiment, the number of electrodes 26 connected to n-type heavily doped polycrystalline silicon layer 25 may be changed depending on the on and off states.

Eighth Embodiment

Figure 53:
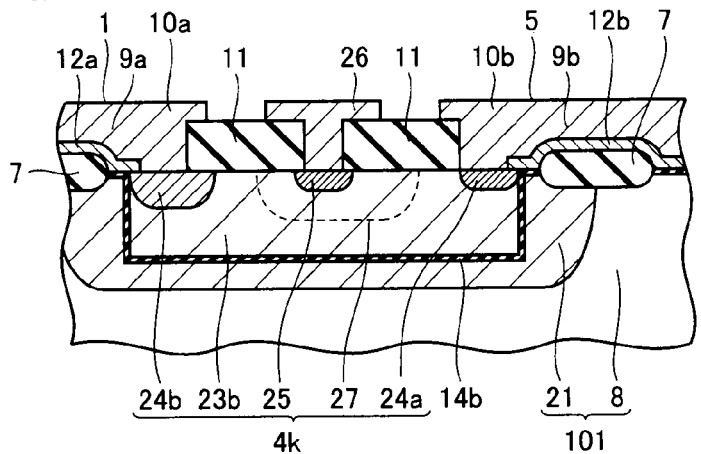

Referring to FIG. 53, an IGBT chip of an eighth embodiment has an internal gate resistance 4k of a junction control diode type as a resistance element.

Internal gate resistance 4k of the junction control diode type has a pn junction surface at a boundary surface between p-type lightly doped polycrystalline silicon layer 23b and n-type heavily doped polycrystalline silicon layer 24a. Thereby, internal gate resistance 4k of the junction control diode type has a structure including a diode.

Structures other than the above are substantially the same as those in the seventh embodiment (FIG. 52) already described. Therefore, the same or corresponding elements bear the same reference numbers, and description thereof is not repeated.

According to this embodiment, the resistance value of the resistance element can be changed by externally applying a potential signal to electrode 26. Also, effects similar to those of the fourth and fifth embodiments can be achieved.

Internal gate resistance 4k of the junction control diode type used as the resistance element may have the conductivity type opposite to that already described.

Although internal gate resistance 4k of the junction control diode type filling first trench T1 is shown in FIG. 53, the resistance element may be of the plane type.

For achieving effects similar to those of the sixth embodiment, the number of electrodes 26 connected to n-type heavily doped polycrystalline silicon layer 25 may be changed depending on the on and off states.

Ninth Embodiment

Figure 54:
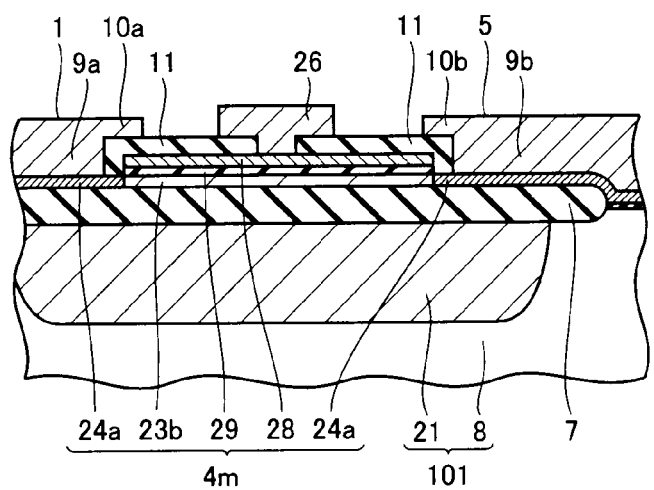

Referring to FIG. 54, an IGBT chip that is a semiconductor device of a ninth embodiment has an MOS (Metal Oxide Semiconductor) gate resistance 4m that is a resistance element including an MIS (Metal Insulator Semiconductor) field-effect transistor. The IGBT chip has electrode 26 for controlling a gate potential of MOS gate resistance 4m itself.

MOS gate resistance 4m has p-type lightly doped polycrystalline silicon layer 23b, a set of n-type heavily doped polycrystalline silicon layers 24a, an internal gate resistance control gate electrode 28 and an internal gate resistance control gate insulating film 29.

p-type lightly doped polycrystalline silicon layer 23b forms a channel region of MOS gate resistance 4m. The set of n-type heavily doped polycrystalline silicon layers 24a have functions of serving as source/drain regions with respect to the above channel region. Internal gate resistance control gate electrode 28 has a function of controlling a carrier concentration in the channel region depending on the potential of internal gate resistance control gate electrode 28. Internal gate resistance control gate insulating film 29 isolates internal gate resistance control gate electrode 28 from p-type lightly doped polycrystalline silicon layer 23b. Electrode 26 has a function of controlling the potential of internal gate resistance control gate electrode 28.

Structures other than the above are substantially the same as those in the third modification of the fourth embodiment (FIG. 49) already described. Therefore, the same or corresponding elements bear the same reference numbers, and description thereof is not repeated.

According to this embodiment, the resistance value of the resistance element can be changed by externally applying a potential signal to electrode 26. Also, effects similar to those of the fourth and fifth embodiments can be achieved.

Although MOS gate resistance 4m of the n-channel type is used in the embodiment already described, MOS gate resistance 4m may be of the p-channel type.

Although FIG. 54 shows MOS gate resistance 4m of the plane type, the resistance element of the trench type filling first trench T1 may be employed.

The MOS transistor included in MOS gate resistance 4m may be of either the enhancement type or the depression type.

For achieving effects similar to those of the sixth embodiment, the number of electrodes 26 connected to internal gate resistance control gate electrode 28 may be changed depending on the on and off states.

Tenth Embodiment

Figure 55:
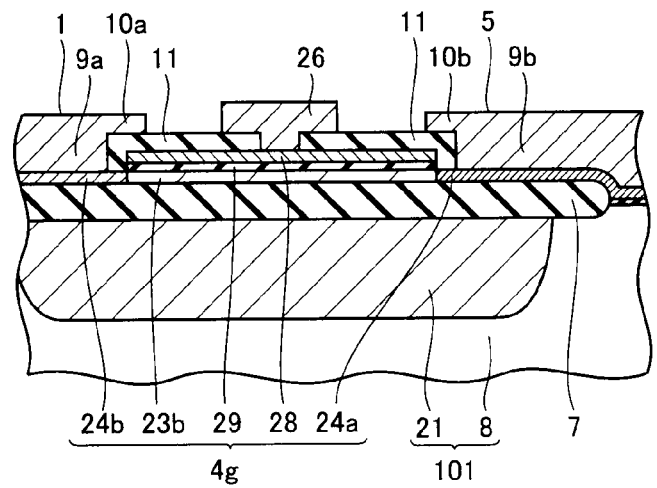

Referring to FIG. 55, an IGBT chip that is a semiconductor device of a tenth embodiment has a gate resistance 4g of a gate control diode type as a resistance element. The IGBT chip has electrode 26 for controlling the gate potential of gate control diode type gate resistance 4g itself.

Gate control diode type gate resistance 4g has p-type lightly doped polycrystalline silicon layer 23b, p-type heavily doped polycrystalline silicon layer 24b, n-type heavily doped polycrystalline silicon layer 24a, internal gate resistance control gate electrode 28 and internal gate resistance control gate insulating film 29.

Structures other than the above are substantially the same as those in the ninth embodiment (FIG. 54) already described. Therefore, the same or corresponding elements bear the same reference numbers, and description thereof is not repeated.

According to this embodiment, the resistance value of the resistance element can be changed by externally applying the potential signal to electrode 26. Also, effects similar to those of the fourth and fifth embodiments can be achieved.

Although gate control diode type gate resistance 4g of the n-channel type is used in this embodiment, gate control diode type gate resistance 4g may be of the p-channel type.

Although FIG. 55 shows gate control diode type gate resistance 4g of the plane type, the resistance element of the trench type filling first trench T1 may be employed.

For achieving effects similar to those of the sixth embodiment, the number of electrodes 26 connected to internal gate resistance control gate electrode 28 may be changed depending on the on and off states.

Eleventh Embodiment

First, a structure of a resistance element of a semiconductor device of an eleventh embodiment will be described.

Figure 56A:
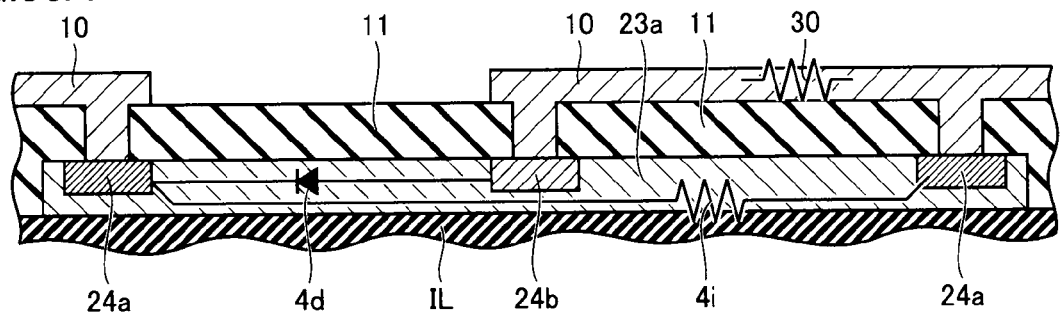
FIG. 56A is a fragmentary cross section schematically showing a structure near a resistance element of a semiconductor device according to an eleventh embodiment of the invention.

Referring to FIG. 56A, the semiconductor device of this embodiment has n-type lightly doped polycrystalline silicon layer 23a, the set of n-type heavily doped polycrystalline silicon layers 24a, and p-type heavily doped polycrystalline silicon layer 24b. This resistance element is formed on an insulating film IL. Insulating film IL is field oxide film 7 or insulating film 14b. The semiconductor device has a set of metal layers 10 on the resistance element.

One set of n-type heavily doped polycrystalline silicon layers 24a are electrically connected together via n-type lightly doped polycrystalline silicon layer 23a. Since n-type heavily doped polycrystalline silicon layer 24a is of the same conductivity type as n-type lightly doped polycrystalline silicon layer 23a, a portion between the set of n-type lightly doped polycrystalline silicon layers 23a has a function as internal gate resistance 4i that is an ohmic resistance.

p-type heavily doped polycrystalline silicon layer 24b is arranged between the set of n-type heavily doped polycrystalline silicon layers 24a. One of n-type heavily doped polycrystalline silicon layers 24a, i.e., n-type heavily doped polycrystalline silicon layer 24a on the left side in FIG. 56A is electrically connected to p-type heavily doped polycrystalline silicon layer 24b via n-type lightly doped polycrystalline silicon layer 23a.

Since p-type heavily doped polycrystalline silicon layer 24b and n-type lightly doped polycrystalline silicon layer 23a have different conductivity types, respectively, a pn junction is formed at a boundary surface between them. Thus, diode type internal gate resistance 4d including the diode of which direction from p-type heavily doped polycrystalline silicon layer 24b to n-type heavily doped polycrystalline silicon layer 24a is a forward direction is formed p- and n-type heavily doped polycrystalline silicon layers 24b and 24a.

According to the above structure, the resistance element of this embodiment includes a region where the diode and the ohmic resistance formed monolithically are arranged in parallel.

One of the set of metal layers 10, i.e., metal layer 10 on the left side in the figure is formed on n-type heavily doped polycrystalline silicon layer 24a on one side, i.e., on the left side in the figure, and is in contact with it.

The other metal layer 10 on the right side in the figure is formed over the other n- and p-type heavily doped polycrystalline silicon layers 24a and 24b, and is in contact with them. The other metal layer 10 is electrically isolated from n-type lightly doped polycrystalline silicon layer 23a by interlayer insulating film 11.

Owing to the above structure of the other metal layer 10, a part of the other metal layer 10 has a function as an ohmic resistance 30 connected in parallel between the other n- and p-type heavily doped polycrystalline silicon layers 24a and 24b.

Structures other than the above are substantially the same as those in the first to tenth embodiment already described. Therefore, the same or corresponding elements bear the same reference numbers, and description thereof is not repeated.

An operation of the resistance element of the semiconductor device of the embodiment will now be described schematically.

When p-type heavily doped polycrystalline silicon layer 24b has a lower potential, the resistance element functions as usual internal gate resistance 4i using n-type lightly doped polycrystalline silicon layer 23a as a resistance.

When p-type heavily doped polycrystalline silicon layer 24b has a higher potential, the relationship between the resistance value of parallel-connected resistance 30 and the impurity concentration of n-type lightly doped polycrystalline silicon layer 23a is appropriately adjusted so that the parallel operations of the diode and the resistance are achieved.

Figure 56B:
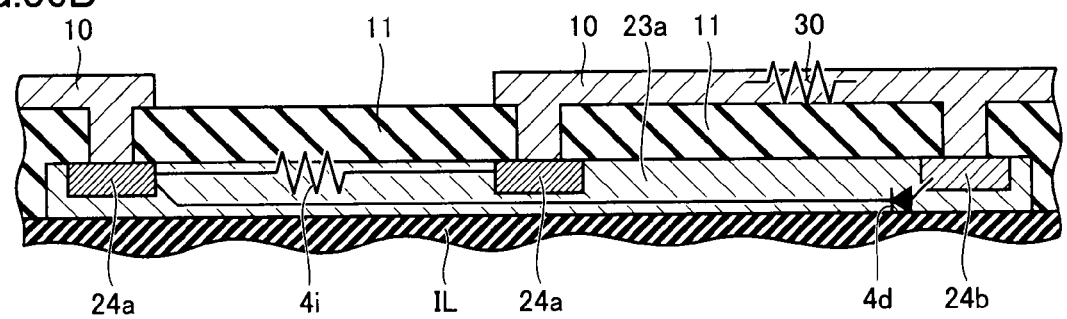
FIG. 56B is a fragmentary cross section schematically showing a structure near a resistance element of a semiconductor device according to a modification of the eleventh embodiment of the invention.

Referring to FIG. 56B, in the modification of this embodiment, p-type heavily doped polycrystalline silicon layer 24b and n-type heavily doped polycrystalline silicon layers 24a on one side (i.e., on the left side in the figure) are located on the opposite sides of n-type heavily doped polycrystalline silicon layers 24a on the other side (i.e., on the right side in the figure), respectively. The one n-type heavily doped polycrystalline silicon layer 24a on the left side in the figure is electrically connected to p-type heavily doped polycrystalline silicon layer 24b via n-type lightly doped polycrystalline silicon layer 23a.

A specific operation of the resistance element of the semiconductor device of this embodiment will now be described.

Figure 57A:
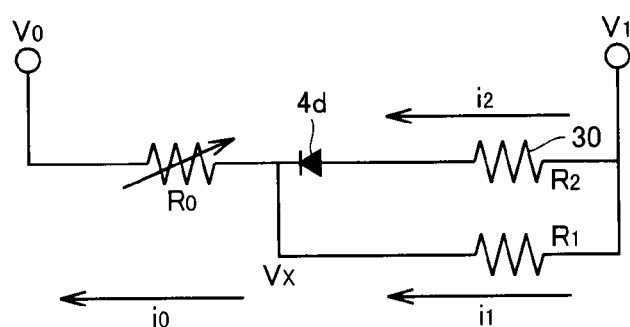
FIG. 57A shows an equivalent circuit of the resistance element in the semiconductor device according to the eleventh embodiment of the invention.
Figure 57B:
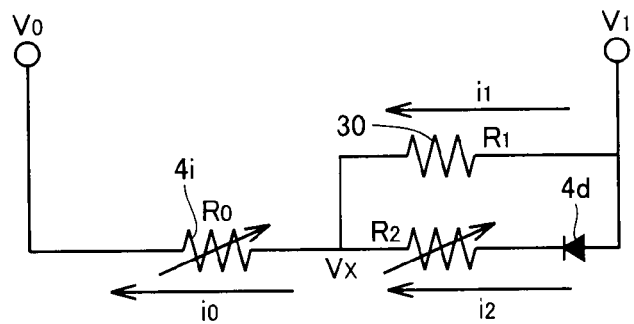
FIG. 57B shows an equivalent circuit of the resistance element of the semiconductor device according to the modification of the eleventh embodiment of the invention.

FIGS. 57A and 57B show equivalent circuits of the resistance elements of the semiconductor devices according to the eleventh embodiment of the invention and the modification thereof, respectively.

Referring to FIGS. 56A and 57A, a potential $V_0$ is held by metal layer 10 on one side (i.e., left side in the figures), and a potential $V_1$ is held by a portion of metal layer 10 on the other side (i.e., right side in the figures) and particularly a portion in contact with n-type heavily doped polycrystalline silicon layer 24a on the other side (i.e., right side in the figures). A potential $V_x$ is held by a portion of metal layer 10 on the other side (i.e., right side in the figures) and particularly a portion in contact with p-type heavily doped polycrystalline silicon layer 24b on the other side (i.e., right side in the figures).

Resistance $R_0$ is present between n- and p-type heavily doped polycrystalline silicon layers 24a and 24b on one side (i.e., left side in the figures) in internal gate resistance 4i. Resistance R1 is present between n- and p-type heavily doped polycrystalline silicon layers 24a and 24b on the other side (i.e., right side in the figures) in internal gate resistance 4i. Resistance $R_2$ is resistance 30.

Currents $i_0$, $i_1$ and $i_2$ flow through resistances $R_0$, $R_1$ and $R_2$, respectively.

Referring to FIGS. 56B and 57B, potential $V_1$ is held by a portion of metal layer 10 on the other side (i.e., right side in the figures) and particularly a portion in contact with p-type heavily doped polycrystalline silicon layer 24b in the modification of this embodiment. Potential $V_x$ is a potential of a portion in contact with n-type heavily doped polycrystalline silicon layer 24a on the other side, i.e., right side in the figures.

Resistance $R_0$ is present between the set of n-type heavily doped polycrystalline silicon layers 24a in internal gate resistance 4i. Resistance $R_1$ is resistance 30. Resistance $R_2$ is present between n- and p-type heavily doped polycrystalline silicon layers 24a and 24b on the other side (i.e., right side in the figures) in internal gate resistance 4i.

Figure 58A:
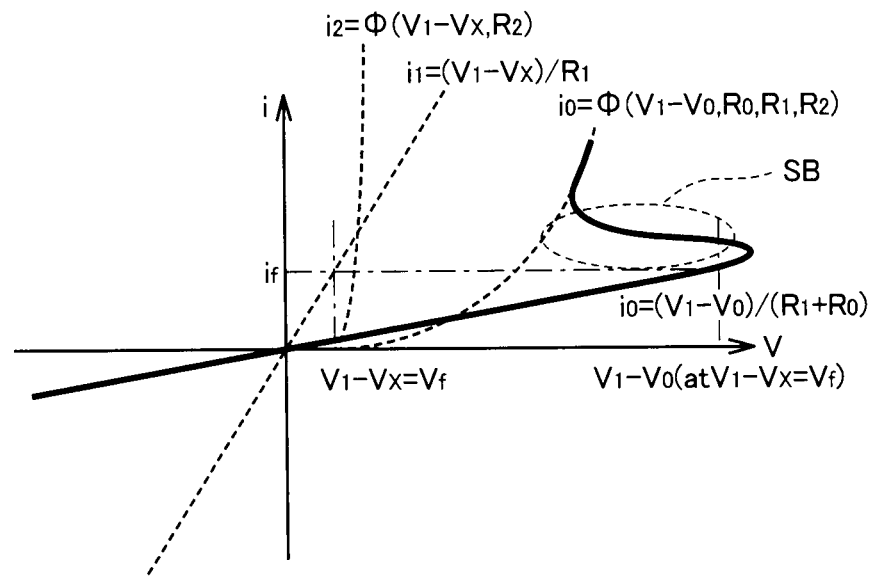
FIG. 58A illustrates voltage-current characteristics exhibited in the case of $(R_2<R_1<<R_0)$ by the resistance elements of the semiconductor devices according to the eleventh embodiment of the invention and the modification thereof.
Figure 58B:
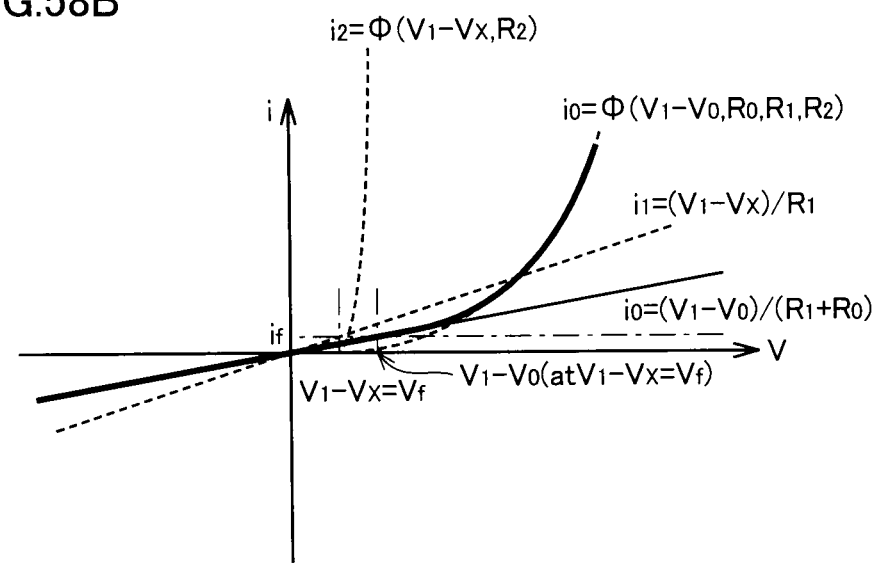
FIG. 58B illustrates voltage-current characteristics exhibited in the case of $(R_1>R_2>>R_0)$ by the resistance elements of the semiconductor devices according to the eleventh embodiment of the invention and the modification thereof.

Referring to FIGS. 58A and 58B, the ordinates in graphs give currents $i_0$, $i_1$ and $i_2$. The abscissas give $(V_1-V_x)$ with respect to currents $i_1$ and $i_2$ indicated by broken lines, and give $(V_1-V_0)$ with respect to current $i_0$. $\Phi$ indicates a function of voltage-current characteristics of the diode.

A voltage step-down $(V_1-V_x)$ caused in resistance $R_1$ that is a part of the resistance components forwardly biases the diode to pass a diode current. For starting this passing of the diode current, predetermined current $i_f$ and voltage $V_f$ are required. In this operation, voltage $(V_1-V_0)$ is applied to the whole resistance element to establish the relationship of $(V_1-V_x=V_f)$. When a current equal to or larger than current if flows through the diode, a current depending on the ratio between resistance $R_1$ of a part of the resistance components and resistance $R_2$ on the diode side flows. However, when the current is flowing through the diode, resistances $R_0$ and $R_2$ in FIG. 57B perform a bipolar operation so that the resistance becomes low.

In the case of $(R_2<R_1<<R_0)$, large current $I_f$ is required. Therefore, current $i_0$ equal to $(V_1-V_0)/(R_1+R_0)$ flows until $(V_1-V_0)$ reaches a certain large value. Then, the diode is turned on, and resistance $R_2$ lowers. Thus, snap-back SB representing a negative resistance occurs.

When $(R_1>R_2>>R_0)$ is established, the diode is turned on even when $I_f$ is small, and therefore snap-back SB does not occur. When $((V_1-V_0)<0)$ is established, the current does not flow through the diode so that the current of $(i_0=(V_1-V_0)/(R_1+R_0))$ flows.

In this embodiment, the resistance element monolithically has the diode and the ohmic resistance in parallel. Therefore, effects similar to those of the semiconductor device of the modification (FIG. 51) of the sixth embodiment can be achieved with a small area.

As shown in FIG. 58A, the resistance characteristics by snap-back SB can be achieved. Therefore, when a certain potential difference occurs between the opposite ends of the resistance element, the snap-back can accelerate the charging and discharging to/from gate electrode 13 of IGBT element EL. As compared with this embodiment, the modification thereof can cause snap-back SB more easily provided that resistance 30 does not increase.

For changing the resistance value of at least a part of n-type lightly doped polycrystalline silicon layer 23a, it is effective to change at least partially the distance between n- and p-type heavily doped polycrystalline silicon layers 24a and 24b as well as the concentration of n-type lightly doped polycrystalline silicon layer 23a.

The resistance element may be of either the trench type or the plane type provided that the heavily doped layer in the intermediate position does not cut off the current path.

A structure achieved by inverting the conductivity types in the structure of this embodiment is substantially equivalent to that of the invention.

Twelfth Embodiment

First, a structure of a resistance element employed in a semiconductor device of a twelfth embodiment will be described.

Figure 59:
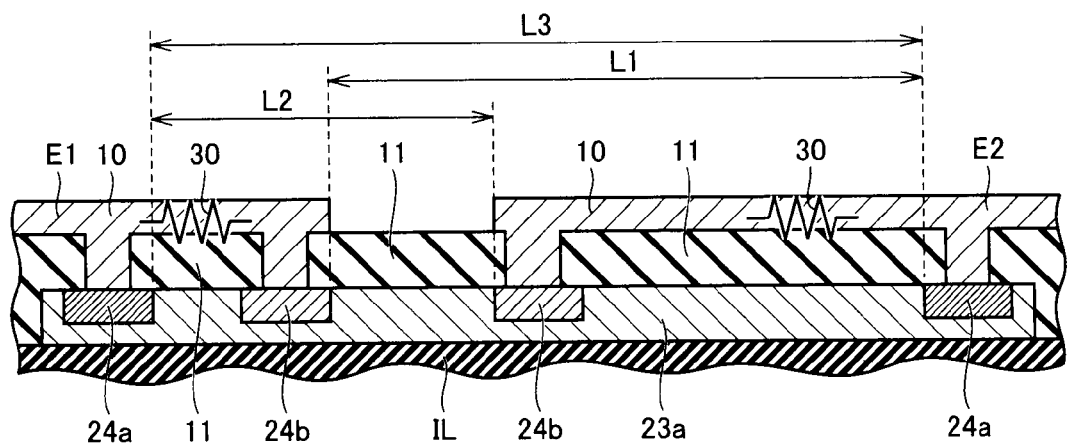
FIGS. 59 and 60 are fragmentary cross sections schematically showing structures near resistance elements of semiconductor devices according to twelfth and thirteenth embodiments of the invention, respectively.

Referring to FIG. 59, the semiconductor device of this embodiment has, as the resistance element, n-type lightly doped polycrystalline silicon layer 23a, the set of n-type heavily doped polycrystalline silicon layers 24a and the set of p-type heavily doped polycrystalline silicon layers 24b. This resistance element is formed on insulating film IL. Insulating film IL is field oxide film 7 or insulating film 14b. The semiconductor device has the set of metal layers 10 on the resistance element.

Each layer in the sets of n- and p-type heavily doped polycrystalline silicon layers 24a and 24b is formed on n-type lightly doped polycrystalline silicon layer 23a.

p- and n-type heavily doped polycrystalline silicon layers 24b and 24a that are located on one and the other sides (i.e., left and right sides in the figure), respectively, are electrically connected via a portion of a length L1 of n-type lightly doped polycrystalline silicon layer 23a. n- and p-type heavily doped polycrystalline silicon layers 24a and 24b that are located on one and the other sides (i.e., left and right sides in the figure), respectively, are electrically connected via a portion of a length L2 of n-type lightly doped polycrystalline silicon layer 23a.

The set of n-type heavily doped polycrystalline silicon layers 24a are electrically connected together via a portion of n-type lightly doped polycrystalline silicon layer 23a having a length L3. Since n-type heavily doped polycrystalline silicon layer 24a and n-type lightly doped polycrystalline silicon layer 23a have the same conductivity type, the portion between the set of n-type lightly doped polycrystalline silicon layers 23a has the function as internal gate resistance 4i serving as the ohmic resistance.

n- and p-type heavily doped polycrystalline silicon layers 24a and 24b on the one side (i.e., left side in the figure) are electrically connected together by metal layer 10 on the one side with resistance 30 interposed therebetween. n- and p-type heavily doped polycrystalline silicon layers 24a and 24b on the other side (i.e., right side in the figure) are electrically connected together by metal layer 10 on the other side with resistance 30 interposed therebetween.

The pn junctions are formed at the boundary surface between p-type heavily doped polycrystalline silicon layer 24b and n-type lightly doped polycrystalline silicon layer 23a on the one side (i.e., left side in the figure) and the boundary surface between p-type heavily doped polycrystalline silicon layer 24b and n-type lightly doped polycrystalline silicon layer 23a on the other side (i.e., right side in the figure), respectively.

One of the paired diodes has the polarity in the forward direction with respect to the direction of the current flowing from metal layer 10 on the one side (i.e., left side in the figure) to metal layer 10 on the other side via p-type heavily doped polycrystalline silicon layer 24b and n-type lightly doped polycrystalline silicon layer 23a on the one side as well as p-type heavily doped polycrystalline silicon layer 24b on the other side (i.e., right side in the figure). The other of the diodes has the polarity in the reverse direction with respect to the same current direction.

In the above structure, the resistance element of this embodiment includes a pair of regions having the diode and the ohmic resistance in parallel, and these paired regions have the diodes of the opposite polarities, respectively.

Structures other than the above are substantially the same as those in the eleventh embodiment already described. Therefore, the same or corresponding elements bear the same reference numbers, and description thereof is not repeated.

An operation of the resistance element in the semiconductor device of this embodiment will now be described.

When the potential on a side E1 of metal layer 10 on the one side (i.e., left side in the figure) is higher than that on a side E2 of metal layer 10 on the other side (i.e., right side in the figure), the diode in the region of length L1 in n-type lightly doped polycrystalline silicon layer 23a is activated by a voltage applied thereto in the forward direction. Also, the diode in the region of length L2 of n-type lightly doped polycrystalline silicon layer 23a is deactivated by the voltage applied in the reverse direction.

Conversely, when the potential on side E1 is lower than that on side E2, the diode in the region of length L1 of n-type lightly doped polycrystalline silicon layer 23a is deactivated by the voltage applied in the reverse direction. Also, the diode in the region of length L2 of n-type lightly doped polycrystalline silicon layer 23a is activated by the voltage applied in the forward direction.

The resistance of the portion of length L3 of n-type lightly doped polycrystalline silicon layer 23a becomes active regardless of the potential relationship between sides E1 and E2.

In this embodiment, the resistance value of the resistance element with respect to each of the voltage directions between sides E1 and E2 can be adjusted independently of the other direction by changing lengths L1 and L2. Therefore, the gate resistance in the on state of switching of IGBT element EL can be adjusted independently of that in the off state.

Similarly to the structure of the eleventh embodiment shown in FIG. 56A, the negative resistance characteristics can be achieved by the snap-back when the potential difference between the opposite ends of the resistance element attains a certain value. For this, resistance 30 of metal layer 10 connected in parallel may be increased, the resistance of at least a part of n-type lightly doped polycrystalline silicon layer 23a may be lowered or a distance between n- and p-type heavily doped polycrystalline silicon layers 24a and 24b connected by metal layer 10 may be reduced.

Similarly to the relationship between the structures in FIGS. 56A and 56B illustrating the eleventh embodiment, the positions of n- and p-type heavily doped polycrystalline silicon layers 24a and 24b in FIG. 59 may be replaced with each other.

The resistance element may be of either the trench type or the plane type provided that the heavily doped layer in the intermediate position does not cut off the current path.

A structure achieved by inverting the conductivity types in the structure of this embodiment is substantially equivalent to that of the invention.

Thirteenth Embodiment

First, a structure of the resistance element of the semiconductor device of the embodiment will be described.

Figure 60:
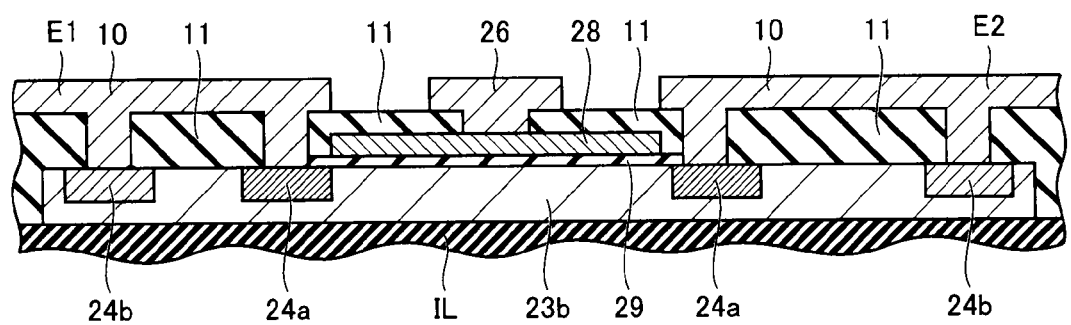

Referring to FIG. 60, the semiconductor device of the embodiment has, as the resistance element, p-type lightly doped polycrystalline silicon layer 23b, the set of n-type heavily doped polycrystalline silicon layers 24a, the set of p-type heavily doped polycrystalline silicon layers 24b, internal gate resistance control gate insulating film 29 and internal gate resistance control gate electrode 28. The semiconductor device has electrode 26 and the set of metal layers 10 on the resistance element.

The set of p-type heavily doped polycrystalline silicon layers 24b are arranged on p-type lightly doped polycrystalline silicon layer 23b, and are electrically connected together via p-type lightly doped polycrystalline silicon layer 23b. Since p-type heavily doped polycrystalline silicon layer 24b and p-type lightly doped polycrystalline silicon layer 23b have the same conductivity type, the set of p-type heavily doped polycrystalline silicon layers 24b has the function as usual internal gate resistance 4i.

The set of n-type heavily doped polycrystalline silicon layers 24a are arranged on p-type lightly doped polycrystalline silicon layer 23b. Internal gate resistance control gate insulating film 29 and internal gate resistance control gate electrode 28 are arranged in this order on p-type lightly doped polycrystalline silicon layer 23b located between the set of n-type heavily doped polycrystalline silicon layers 24a. Owing to the above structure, the resistance element of this embodiment has the MIS structure, and includes substantially the same structure as MOS gate resistance 4m (FIG. 54) of the ninth embodiment.

The semiconductor layers such as p-type lightly doped polycrystalline silicon layer 23b in the above MIS structure are arranged on insulating film IL. Thus, the resistance element has the SOI type of structure.

The IGBT chip has electrode 26 for controlling the gate potential of MOS gate resistance 4m itself.

One end (i.e., left end in the figure) of the portion corresponding to internal gate resistance 4i in this embodiment is electrically connected to one end of the portion corresponding to MOS gate resistance 4m by metal layer 10 on one side. The other end (i.e., right end in the figure) of the portion corresponding to internal gate resistance 4i is electrically connected to the other end of the portion corresponding to MOS gate resistance 4m by metal layer 10 on the other side. Thus, the resistance element has the structure in which MOS gate resistance 4m and internal gate resistance 4i are connected in parallel.

Structures other than the above are substantially the same as those in the eleventh embodiment already described. Therefore, the same or corresponding elements bear the same reference numbers, and description thereof is not repeated.

An operation of the resistance element in the semiconductor device of this embodiment will now be described.

When electrode 26 receives the signal, the potential of internal gate resistance control gate electrode 28 changes to control the channel of p-type lightly doped polycrystalline silicon layer 23b on the side of internal gate resistance control gate insulating film 29. Thereby, the resistance value of the portion corresponding to MOS gate resistance 4m is externally controlled.

By providing the signal to electrode 26 to eliminate the channel, the resistance value of the resistance element is maximized and becomes the resistance value of internal gate resistance 4i.

Conversely, by providing the signal to electrode 26 to form the channel by the inversion layer, a current path passing through MOS gate resistance 4m is added to the resistance element so that the resistance value decreases.

According to the embodiment, the resistance element has the portion corresponding to internal gate resistance 4i and the portion corresponding to MOS gate resistance 4m that are connected in parallel. Thereby, the resistance value of the resistance element can be externally changed with ease. In contrast to the ninth embodiment (FIG. 54), the maximum value of the resistance value can be the resistance value of the portion corresponding to internal gate resistance 4i. Since the portion corresponding to internal gate resistance 4i and the portion corresponding to MOS gate resistance 4m are layered in the direction of thickness of semiconductor substrate 101, the resistance element can be formed on a portion of a small area of semiconductor substrate 101.

Although this embodiment has been described in connection with the parallel structure of n-channel MOS gate resistance 4m and usual internal gate resistance 4i made of the p-type semiconductor layer, the combination of the conductivity types of MOS gate resistance 4m and usual internal gate resistance 4i is not restricted.

MOS gate resistance 4m may be of either the enhancement type or the depression type.

The resistance element may be of either the plane type or the trench type.

In the eleventh to thirteenth embodiments already discussed, the combinations of the structures in the first and third to tenth embodiments are monolithically formed, but the combinations are not restricted to the structures already described.

Figure 61A:
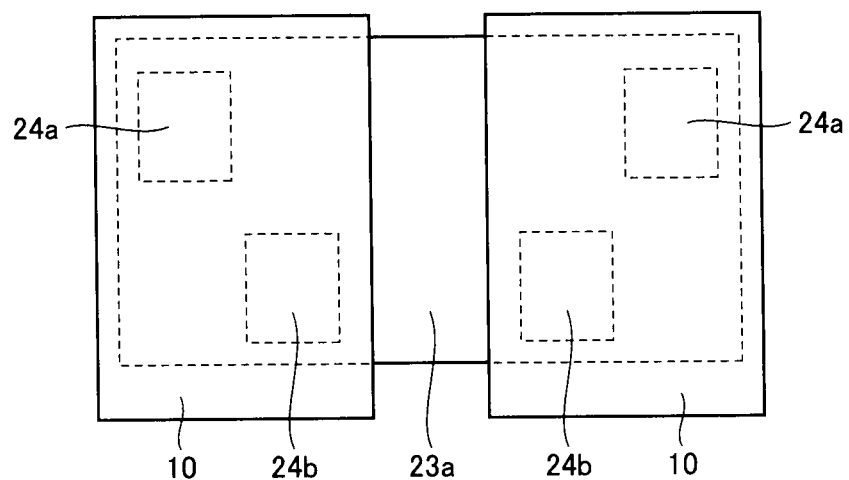
FIGS. 61A and 61B are plan views schematically showing structures of resistance elements of semiconductor devices according to modifications of the twelfth and thirteenth embodiments of the invention, respectively.
Figure 61B:
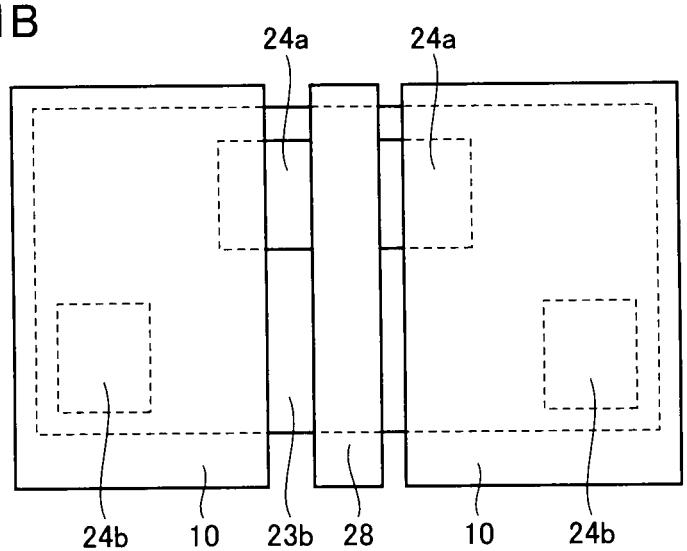

For example, diode type internal gate resistance 4d may be replaced with a Zener diode type gate resistance already described in connection with the fifth embodiment. MOS gate resistance 4m may be replaced with JFET type gate resistance 4j. The impurity concentration of internal gate resistance 4i may be adjusted as already described in connection with the third embodiment.

n- and p-type heavily doped polycrystalline silicon layers 24a and 24b may be arranged in a plane, i.e., two dimensional fashion and more particularly in a direction perpendicular to a sheet of each sectional view. For example, the resistance elements of the twelfth embodiment (FIG. 59) and the thirteenth embodiment (FIG. 60) may be arranged in fashions shown in FIGS. 61A and 61B, respectively.

In the examples already described, one resistance element is provided with n- or p-type lightly doped polycrystalline silicon layer 23a or 23b. However, the invention is not restricted to this. For example, a shared contact may be employed for electric connection of n- and p-type heavily doped polycrystalline silicon layers 24a and 24b to metal layer 10, and thereby the silicon layer having both n- and p-type lightly doped polycrystalline silicon layers 23a and 23b may be employed.

Fourteenth Embodiment

The first to thirteenth embodiments have been described primarily in connection with the resistance element itself that is the gate resistance connected to IGBT element EL. In the actual IGBT chip, gate main interconnection 5 and gate electrode 13 have electric resistances in themselves. Accordingly, gate main interconnection 5 and gate electrode 13 operate as parasitic gate resistances.

In IGBT element EL having the plurality of gate electrodes 13, gate electrode 13 remote from gate pad 1 has a long interconnection path from gate pad 1, and therefore is affected by the parasitic gate resistance to a higher extent. Conversely, gate electrode 13 near gate pad 1 is hardly affected by the parasitic gate resistance.

Therefore, depending on the lengths of the interconnection paths from gate pad 1, differences in on/off operation times of IGBT element EL occur between the cells provided with respective gate electrodes 13. Consequently, the current may concentrate at a part of cells, and the Q value with respect to a part of amplifiers at which the current concentrates increases to cause oscillation as described before.

Figure 62:
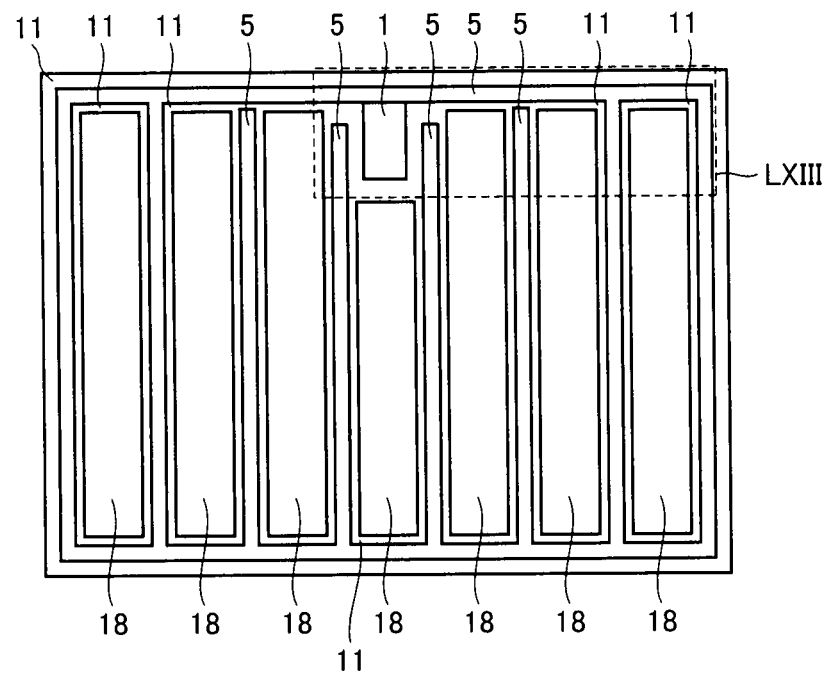
FIG. 62 is a top view schematically showing a structure of a semiconductor device according to a fourteenth embodiment of the invention.
Figure 63:
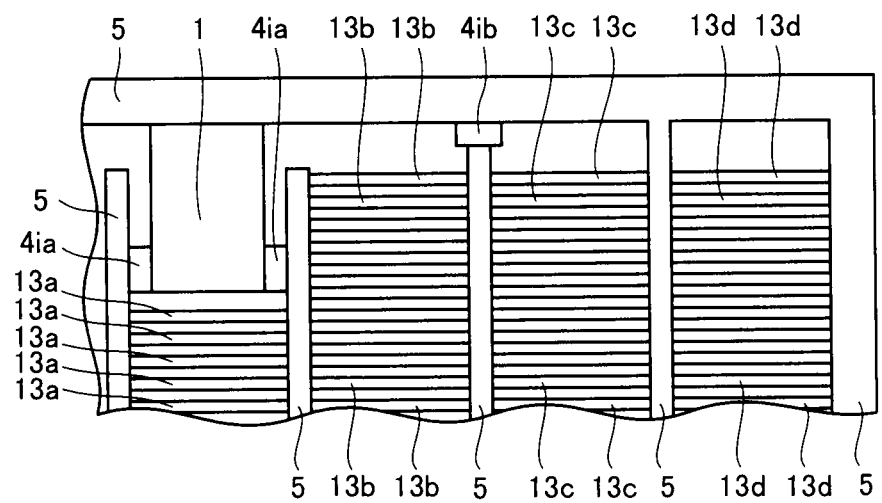
FIG. 63 is a fragmentary plan view schematically showing a portion indicated by LXIII in FIG. 62.

Referring to FIGS. 62 and 63, the IGBT chip that is the semiconductor device of this embodiment has a plurality of gate electrodes 13a-13d. Lengths of interconnections that electrically connect gate pad 1 to gate electrodes 13a, 13b, 13c and 13d, respectively, increase in this order (i.e., in the order of 13a, 13b, 13c and 13d).

The IGBT chip has an internal gate resistance 4ia that is a resistance element as well as an internal gate resistance 4ib that is a resistance element having a smaller resistance value than internal gate resistance 4ia. Gate pad 1 and a part (upper part in FIG. 63) of gate main interconnection 5 are formed integrally with each other, and are electrically connected together.

Gate electrode 13a and gate pad 1 are electrically connected together via internal gate resistance 4ia.

A portion of gate electrode 13b near gate pad 1 is electrically connected to gate pad 1 via internal gate resistance 4ia. A portion of gate electrode 13b remote from gate pad 1 is electrically connected to gate pad 1 via internal gate resistance 4ib.

A portion of gate electrode 13c near gate pad 1 is electrically connected to gate pad 1 via internal gate resistance 4ib. A portion of gate electrode 13c remote from gate pad 1 is electrically connected to gate pad 1 without interposing an internal gate resistance.

Portions of gate electrode 13c near and remote from gate pad 1 are electrically connected to gate pad 1 without interposing an internal gate resistance.

Structures other than the above are substantially the same as those in the first to thirteenth embodiments already described. Therefore, the same or corresponding elements bear the same reference numbers, and description thereof is not repeated.

According to the embodiment, internal gate resistance 4ia connected to gate electrode 13a relatively near gate pad 1 has the larger resistance value than internal gate resistance 4ib connected to gate electrodes 13b and 13c relatively remote from gate pad 1. Also, gate electrode 13d substantially remotest from gate pad 1 is connected to gate pad 1 without interposing any one of internal gate resistances 41a and 41b therebetween.

Thereby, the variations in parasitic gate resistance described above can be cancelled to a certain extent, and the variations in degree or extent of the delay of the electric signals depending on interconnection paths from gate pad 1 can be suppressed. Therefore, it is possible to suppress the differences that may occur in transmission delay between the potential signals transmitted to the respective gate electrodes due to the interconnections between gate pad 1 and the respective gate electrodes. Therefore, it is possible to achieve the IGBT chip that suppresses local current concentration at the on region in IGBT element EL, and is resistant to the oscillation.

Fifteenth Embodiment

The first to fourteenth embodiments have been described in connection with the resistance element each of which is electrically connected to gate electrode 13 and functions as the gate resistance. However, the electrode electrically connected to the resistance element of the invention is not restricted to gate electrode 13, and the resistance element may be connected to another electrode, or may be arranged between interconnection layers.

Figure 64:
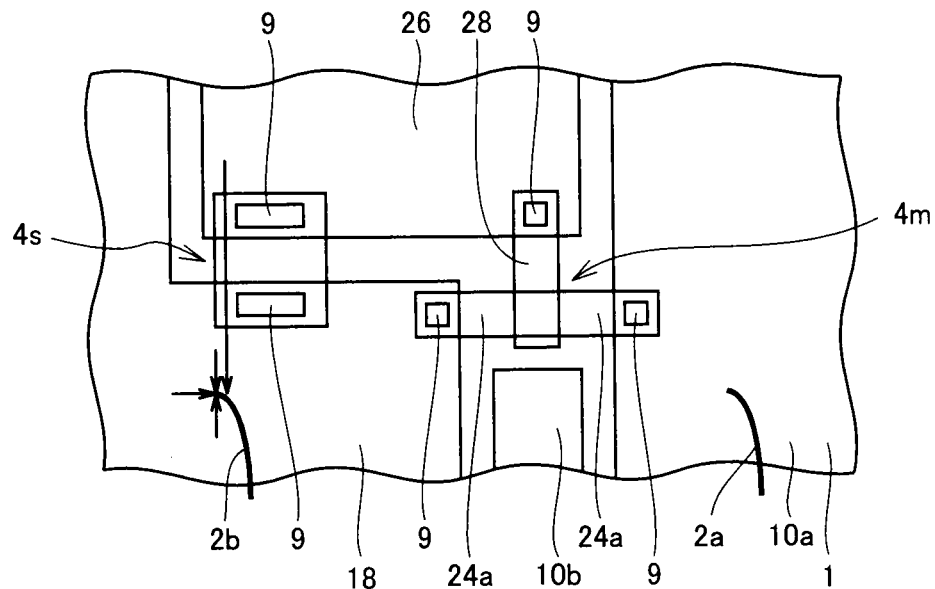
FIG. 64 is a fragmentary plan view schematically showing a plane layout near a resistance element of a semiconductor device according to a fifteenth embodiment of the invention together with arrows schematically indicating directions of current flows.

Referring primarily to FIG. 64, an IGBT chip that is a semiconductor device of a fifteenth embodiment has emitter pad 18 that is an usual emitter electrode (first emitter electrode), and electrode 26 that is a sense pad (second emitter electrode). The IGBT chip has a shunt resistance (first resistance element) 4s serving as a resistance element, and an MOS gate resistance (second resistance element) 4m.

The IGBT chip has wire 2a extending to gate pad 1, a wire 2b extending to emitter pad 18 and a contact 9 for electric connection.

Figure 66:
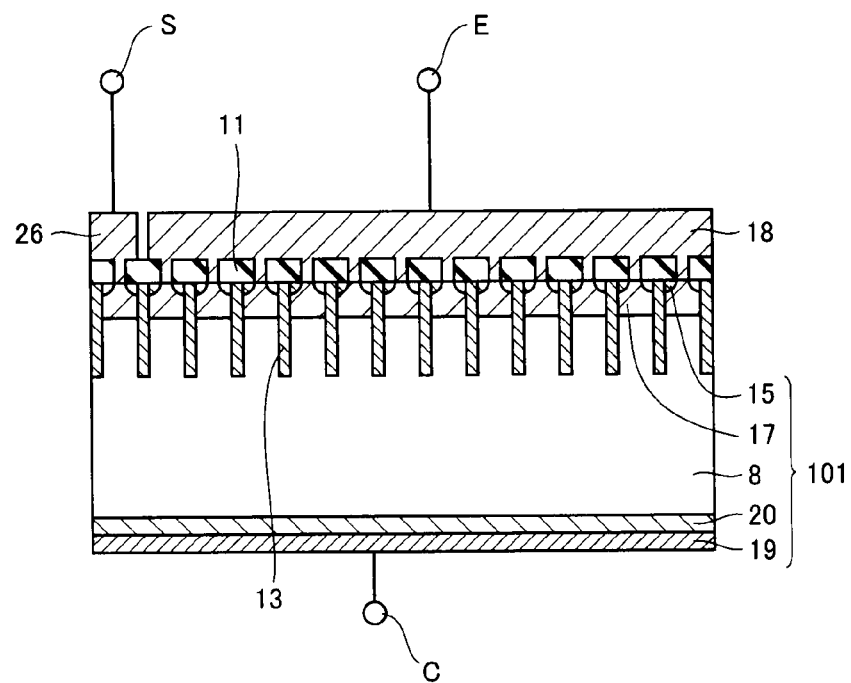
FIG. 66 is a schematic cross section illustrating a structure of a sense electrode of the semiconductor device according to the fifteenth embodiment of the invention.

Referring to FIG. 66, a sense pad (electrode 26) receives a divided current, e.g., equal to $\frac{1}{100}$ of the emitter current. In FIG. 66, S indicates a sense terminal, E indicates an emitter terminal and C indicates a collector terminal.

Referring to FIG. 64 again, shunt resistance 4s electrically connects emitter pad 18 to the sense pad (electrode 26). Thereby, shunt resistance 4s has a function of generating a potential difference depending on the current flowing through shunt resistance 4s between emitter pad 18 and sense pad (electrode 26). A specific structure of shunt resistance 4s may be the same as those of the resistance elements in the first to thirteenth embodiments already described.

MOS gate resistance 4m electrically connects gate pad 1 and emitter pad 18 together. Internal gate resistance control gate electrode 28 of MOS gate resistance 4m is electrically connected to the sense pad (electrode 26). Thereby, MOS gate resistance 4m has the function of electrically connecting gate pad 1 and emitter pad 18 together with an electric resistance corresponding to the potential of the sense pad (electrode 26). Internal gate resistance control gate electrode 28 may be integral with electrode 26.

Structures other than the above are substantially the same as those in the first to fourteenth embodiments already described. Therefore, the same or corresponding elements bear the same reference numbers, and description thereof is not repeated.

An operation of the resistance element in the IGBT chip of this embodiment will now be described.

When a high current flows through shunt resistance 4s, a potential difference between the opposite ends of shunt resistance 4s increases. Thereby, when MOS gate resistance 4m is, e.g., an enhancement type n-channel MOSFET, gate pad 1 and emitter pad 18 are short-circuited. When MOS gate resistance 4m is, e.g., a depression type p-channel MOSFET, gate pad 1 and emitter pad 18 are connected with a high electric resistance therebetween.

Figure 65:
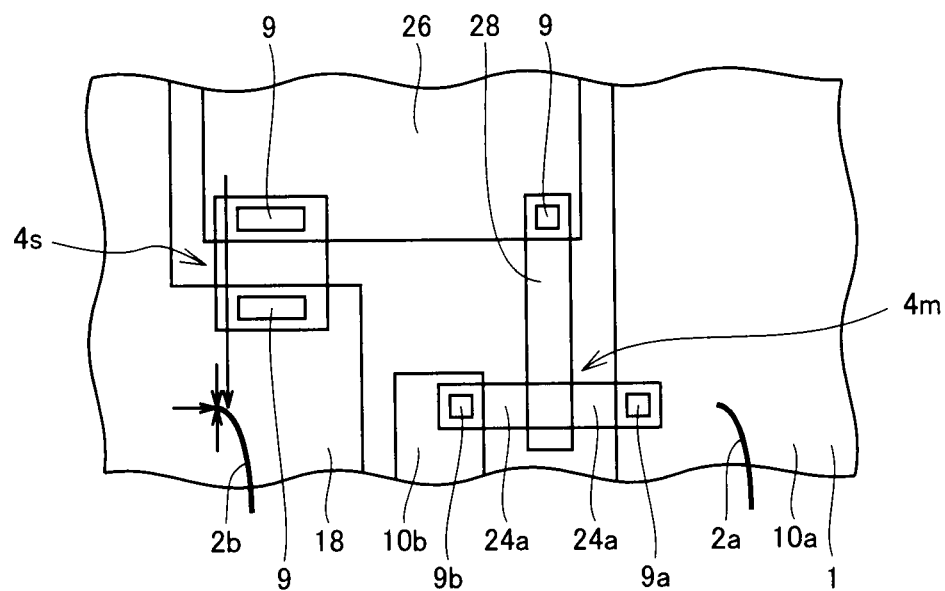
FIG. 65 is a fragmentary plan view schematically showing a plane layout near a resistance element of a semiconductor device according to a modification of the fifteenth embodiment of the invention together with arrows schematically indicating directions of current flows.

Referring to FIG. 65, in a modification of this embodiment, MOS gate resistance 4m electrically connects gate pad 1 to main interconnection metal layer 10b.

In this embodiment, it is not necessary to connect a wire to the sense pad (electrode 26) in contrast to the structure in which the shunt resistance is arranged outside the IGBT chip. Thereby, the area of sense pad (electrode 26) can be reduced, and the sizes of the IGBT chip can be reduced. Also, an excess current can be detected rapidly.

FIGS. 64 and 65 show the example in which the signal generated on the sense pad (electrode 26) is directly transmitted to internal gate resistance control gate electrode 28 of MOS gate resistance 4m. However, the invention is not restricted to this structure. For example, a logic circuit formed on a semiconductor layer electrically isolated from semiconductor substrate 101 may be obtained by applying energy rays such as laser rays to an amorphous silicon layer deposited, e.g., on an insulating film, and a result output of this logic circuit may be applied to internal gate resistance control gate electrode 28.

When the Zener diode type gate resistance in the fifth embodiment is used as shunt resistance 4s, the output voltage generated on the sense pad can be substantially constant.

Sixteenth Embodiment

The first to fifteenth embodiments have been described in connection with the example in which various resistance elements are arranged between the plurality of isolated conductor layers. The trench structure serving as the current path in the first to third embodiments is effective at reducing the parasitic resistance value, e.g., of the gate main interconnection.

Figure 67:
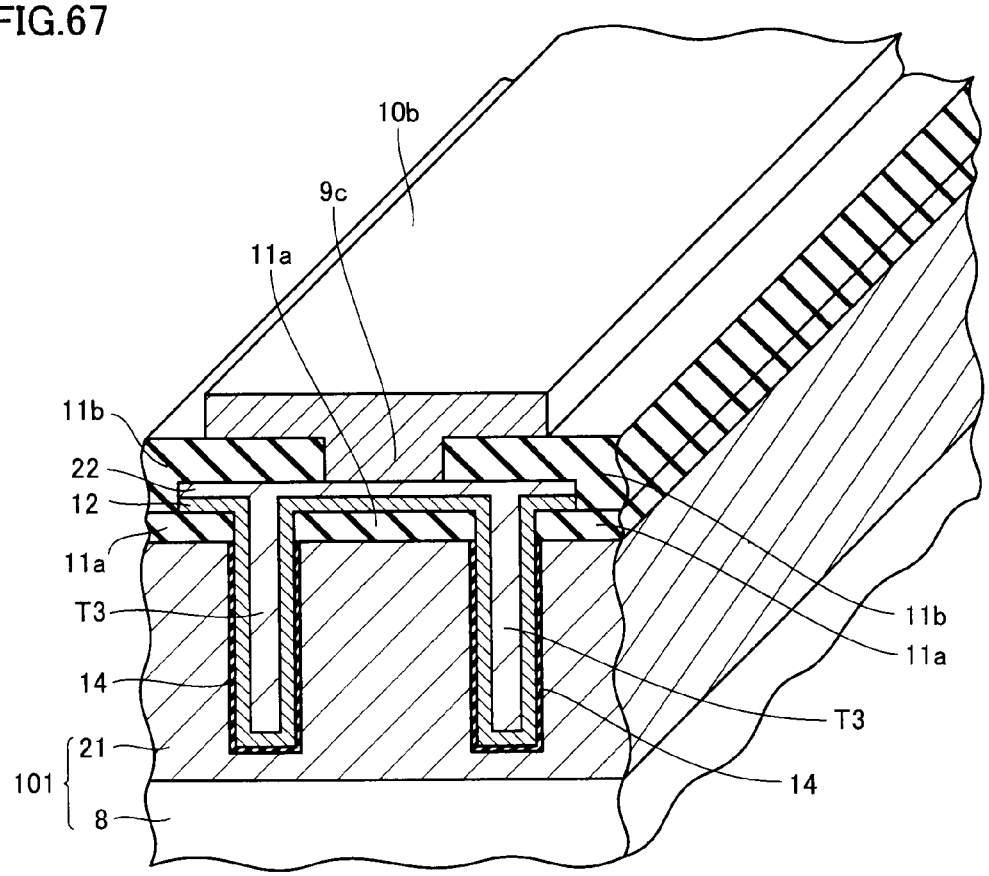
FIG. 67 is a perspective view schematically and fragmentarily showing a section of a structure near a gate main interconnection of a semiconductor device according to a sixteenth embodiment of the invention.

Referring to FIG. 67, a gate main interconnection of this embodiment has main interconnection metal layer 10b, metal portion 22 and polycrystalline silicon layer 12. Semiconductor substrate 101 has a trench T3 having an inner surface covered with an interlayer insulating film 14.

At least a part of the interconnection (first interconnection) formed of polycrystalline silicon layer 12 and metal portion 22 is arranged in trench T3 with interlayer insulating film 14 therebetween. Main interconnection metal layer 10b (second interconnection) is arranged on trench T3. Main interconnection metal layer 10b and metal portion 22 are connected by a portion in a contact hole 9c of the gate main interconnection, and thereby are electrically connected together in parallel. Thus, the first and second interconnections are electrically connected in parallel.

Structures other than the above are substantially the same as those in the first to fifteenth embodiments already described. Therefore, the same or corresponding elements bear the same reference numbers, and description thereof is not repeated.

Figure 68:
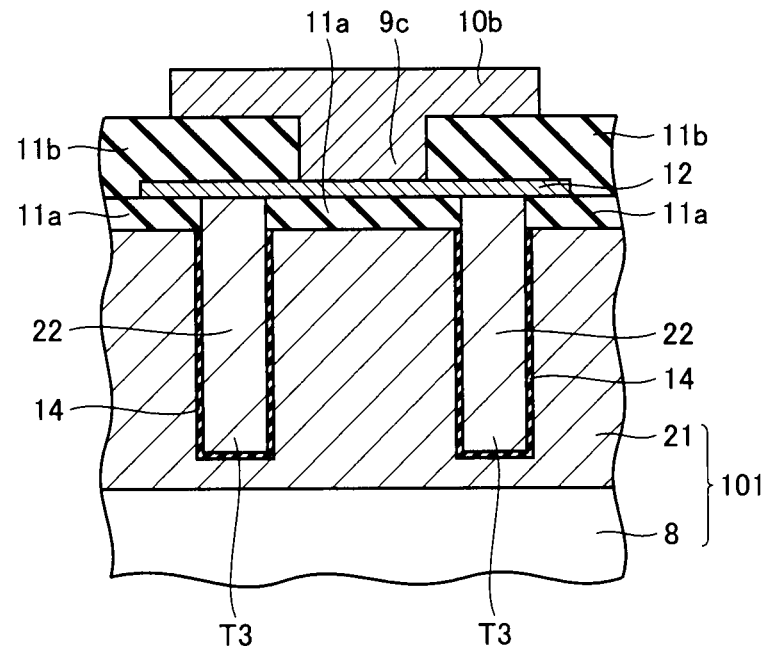
FIG. 68 is a fragmentary cross section schematically showing a structure near a gate main interconnection of a semiconductor device according to a first modification of the sixteenth embodiment of the invention.
Figure 69:
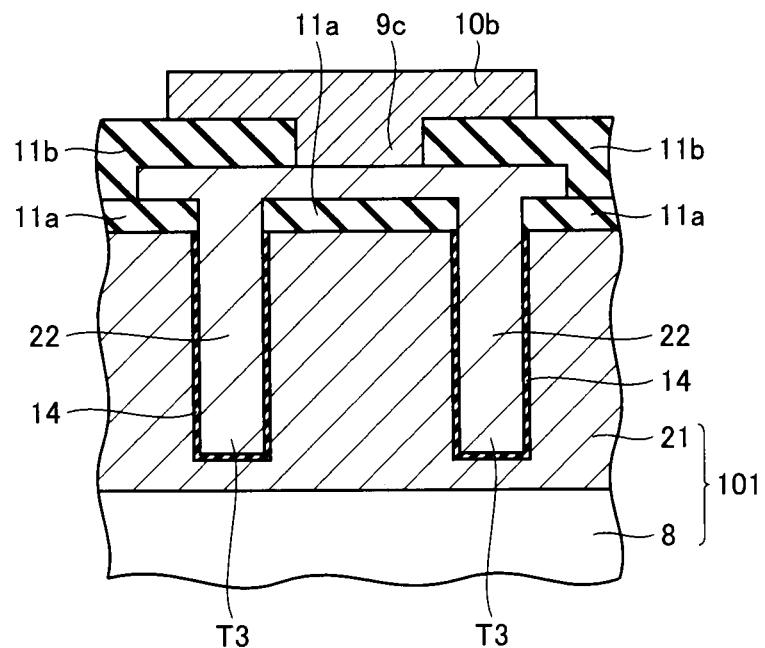
FIG. 69 is a fragmentary cross section schematically showing a structure near a gate main interconnection of a semiconductor device according to a second modification of the sixteenth embodiment of the invention.

FIGS. 68 and 69 are fragmentary cross sections schematically showing structures near the gate main interconnections of the semiconductor devices in first and second modifications of the sixteenth embodiment of the invention, respectively.

Referring to FIG. 68, trench T3 in the first modification has the inner surface covered with insulating film 14, and is filled with only metal portion 22.

Referring to FIG. 69, polycrystalline silicon layer 12 is eliminated, and main interconnection metal layer 10b and metal portion 22 are connected by a portion in contact hole 9c in the second modification.

In this embodiment, since the gate main interconnection has a portion filling trench T3, the parasitic resistance can be small, as compared with a plane-type interconnection having a constant size in the direction of width (i.e., lateral size in the figure) of gate main interconnection 5. This suppresses a difference in transmission delay that may occur between the potential signals transmitted to respective gate electrodes 13 due to the interconnections between gate pad 1 and respective gate electrodes 13. Therefore, it is possible to achieve the IGBT chip that suppresses local current concentration at the on region in IGBT element EL and is resistant to the oscillation.

Each embodiment has been described in connection with the semiconductor device having IGBT element EL has the semiconductor element. However, the invention is not restricted to them, and can be applied to semiconductor devices having a semiconductor element such as a power MOSFET element. Further, the semiconductor element may have a source electrode instead of the emitter electrode.

Also, metal layer 10 may be replaced with a semiconductor layer having a sufficiently lower resistance that the internal gate resistance.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a semiconductor substrate having a first trench;
   an insulating film covering an inner surface of said first trench that includes four sidewall surfaces joined by a bottom surface;
   a semiconductor element having a gate electrode;
   a gate signal source arranged separately from said gate electrode;
   a resistance element including a semiconductor layer and first and second metal layers arranged in said first trench with said insulating film therebetween, said resistance element having one end and another end, said one end being electrically connected to said gate signal source via said first metal layer, said another end being electrically connected to said gate electrode via said second metal layer, said resistance element forming a resistance between said gate signal source and said gate electrode, said first and second metal layers only being electrically connected to each other via said semiconductor layer, wherein
   said first and second metal layers are separately connected to different portions of said semiconductor layer,
   said semiconductor layer having a part arranged in said first trench extending between the first and second metal layers, said part being composed of a material of a single first conductivity type and the semiconductor substrate includes a first region of a single second conductivity type and all surfaces of the inner surface of the first trench are entirely formed in said first region of the single second conductivity type of the semiconductor substrate;
   the insulating film has an entire surface in contact with the first region of the single second conductivity type, and
   a signal to be provided to the gate electrode via the resistance element is input to the gate signal source.

2. The semiconductor device according to claim 1, wherein
   an interlayer insulating film has a contact hole on an opening side of said first trench of said resistance element, and
   one of the different portions of said semiconductor layer provided at a position opposed to said contact hole has a width larger than a width of the part of said semiconductor layer opposed to said interlayer insulating film.

3. The semiconductor device according to claim 2, wherein
   said portion having the larger width includes a portion having a lower resistivity than the part.

4. The semiconductor device according to claim 2, wherein,
   said semiconductor element has a gate insulating film,
   said semiconductor substrate has a second trench,
   said gate insulating film covers an inner surface of said second trench,
   said gate electrode is arranged in said second trench with said gate insulating film therebetween, and
   said gate electrode has a width larger than the width of the part of said semiconductor layer opposed to said interlayer insulating film.

5. The semiconductor device according to claim 4, wherein
   said gate electrode has a portion having a lower resistivity than the part.

6. The semiconductor device according to claim 1, wherein all current that passes between said gate signal source and said gate electrode passes via the resistance element.

7. The semiconductor device according to claim 1, further comprising: an interlayer insulating film covering said resistance element and arranged between said first and second metal layers.

8. The semiconductor device according to claim 1, wherein an interlayer insulating film contacts said resistance element, said gate signal source, and said gate electrode.

9. The semiconductor device according to claim 1, wherein said resistance element allows current to flow in both directions between the one and another ends of said resistance element throughout a same voltage range.

10. The semiconductor device according to claim 1, wherein said gate signal source provides a gate signal that is designated for the gate electrode.

11. The semiconductor device according to claim 1, wherein said gate signal source is a gate pad.

12. The semiconductor device according to claim 1, wherein the depth of said first trench is less than a distance between two opposing sidewalls of said first trench.

13. The semiconductor device according to claim 1, wherein the semiconductor substrate includes a second region of the single first conductivity type.

* * * * *